(12) United States Patent
Asadi et al.

(10) Patent No.: US 11,088,693 B2
(45) Date of Patent: Aug. 10, 2021

(54) CONFIGURABLE LOGIC BLOCK FOR IMPLEMENTING A BOOLEAN FUNCTION

(71) Applicants: Hossein Asadi, Tehran (IR); Elmira Nezamfar, Tehran (IR); Zeinab Seifoori, Tehran (IR)

(72) Inventors: Hossein Asadi, Tehran (IR); Elmira Nezamfar, Tehran (IR); Zeinab Seifoori, Tehran (IR)

(*) Notice: Subject to any disclaimer, the term of this patent is extended or adjusted under 35 U.S.C. 154(b) by 0 days.

(21) Appl. No.: 16/920,804

(22) Filed: Jul. 6, 2020

(65) Prior Publication Data

US 2020/0343894 A1 Oct. 29, 2020

Related U.S. Application Data

(60) Provisional application No. 62/871,202, filed on Jul. 8, 2019.

(51) Int. Cl.
*H03K 19/17728* (2020.01)
*H03K 19/1776* (2020.01)
*G06N 3/063* (2006.01)
*G06N 3/04* (2006.01)
*G06N 3/08* (2006.01)

(52) U.S. Cl.
CPC ........ *H03K 19/17728* (2013.01); *G06N 3/04* (2013.01); *G06N 3/063* (2013.01); *H03K 19/1776* (2013.01); *G06N 3/08* (2013.01)

(58) Field of Classification Search
CPC ......... H03K 19/17728; H03K 19/1776; G06N 3/063; G06N 3/04; G06N 3/08; G06N 3/0454
See application file for complete search history.

(56) References Cited

U.S. PATENT DOCUMENTS

| | | | | |
|---|---|---|---|---|
| 5,155,389 A | * | 10/1992 | Furtek | H03K 19/17728 326/39 |
| 6,215,327 B1 | * | 4/2001 | Lyke | H03K 19/17796 326/10 |
| 2020/0145007 A1 | * | 5/2020 | Bai | H03K 19/1736 |

* cited by examiner

*Primary Examiner* — Daniel D Chang
(74) *Attorney, Agent, or Firm* — Bajwa IP Law Firm; Haris Zaheer Bajwa

(57) ABSTRACT

A method for mapping a Boolean function to a configurable logic block (CLB). The CLB includes a first plurality of programmable logic cells (PLCs). The Boolean function includes a plurality of digits. Each of the plurality of digits includes a respective hexadecimal value. The method includes mapping the Boolean function to a first PLC of the first plurality of PLCs responsive to the plurality of digits satisfying a first condition. In an exemplary embodiment, the first condition includes at least two digits of the plurality of digits being different and each of the plurality of digits including one of a first hexadecimal digit, a second hexadecimal digit different from the first hexadecimal digit, a bitwise complement of the first hexadecimal digit, and a bitwise complement of the second hexadecimal digit.

20 Claims, 16 Drawing Sheets

CONFIGURABLE LOGIC BLOCK FOR IMPLEMENTING A BOOLEAN FUNCTION

CROSS-REFERENCE TO RELATED APPLICATION

This application claims the benefit of priority from pending U.S. Provisional Patent Application Ser. No. 62/871,202, filed on Jul. 8, 2019, and entitled "RECONFIGURABLE LOGIC FOR NEURAL NETWORKS," which is incorporated herein by reference in its entirety.

TECHNICAL FIELD

The present disclosure generally relates to integrated circuits, and particularly, to programmable logic circuits.

BACKGROUND

Deep learning (ML) algorithms implemented on neural networks (NNs) are utilized in a wide range of applications. Selecting an energy-efficient, flexible, and inexpensive hardware is of paramount importance for implementing DL algorithms. Conventional hardware platforms utilized for implementation of DL algorithms include application-specific integrated circuits (ASICs) and graphical processing units (GPUs). However, ASIC platforms suffer from inflexibility, expensive design update, and large time to market. On the other hand, GPUs consume excessive power, resulting in high power and cooling cost in datacenters. In contrast, reconfigurable architectures such as field-programming gate arrays (FPGAs) provide flexibility, low engineering cost, and high energy efficiency. Nonetheless, FPGAs may provide a limited amount of logic and computational resources, resulting in inability to perform high computational demands of some DL algorithms. As a result, resource limitation necessitates an efficient implementation of DL algorithms on FPGAs. Modern FPGA architectures are equipped with digital signal processing (DSP) blocks to enhance both performance and energy efficiency of complicated arithmetic applications. Moreover, configurable logic blocks (CLBs) in FPGAs may be utilized for implementation of Boolean functions that are required for implementation of ML algorithms. Boolean functions are implemented utilizing look-up tables (LUTs) in CLBs. Look-up tables with large number of inputs may be responsible for occupying a considerable amount of area in FPGAs, limiting a room required for placing more DSP blocks and on-chip memory in FPGAs.

There is, therefore, a need for a CLB with LUTs having small number of inputs for implementing Boolean functions. There is also a need for a method for classifying Boolean functions and mapping each class to different logic cells with LUTs having small number of inputs.

SUMMARY

This summary is intended to provide an overview of the subject matter of the present disclosure, and is not intended to identify essential elements or key elements of the subject matter, nor is it intended to be used to determine the scope of the claimed implementations. The proper scope of the present disclosure may be ascertained from the claims set forth below in view of the detailed description below and the drawings.

In one general aspect, the present disclosure describes an exemplary method for mapping a Boolean function to a configurable logic block (CLB). An exemplary CLB may include a first plurality of programmable logic cells (PLCs). An exemplary Boolean function may include a plurality of digits. In an exemplary embodiment, each of the plurality of digits may include a respective hexadecimal value. An exemplary method may include mapping the Boolean function to a first PLC of the first plurality of PLCs responsive to the plurality of digits satisfying a first condition. In an exemplary embodiment, the Boolean function may be mapped utilizing one or more processors. In an exemplary embodiment, the first condition may include at least two digits of the plurality of digits being different and each of the plurality of digits including one of a first hexadecimal digit, a second hexadecimal digit different from the first hexadecimal digit, a bitwise complement of the first hexadecimal digit, and a bitwise complement of the second hexadecimal digit.

An exemplary method may further include mapping the Boolean function to a second PLC of a second plurality of PLCs in the CLB. In an exemplary embodiment, the Boolean function may be mapped to the second PLC responsive to the plurality of digits satisfying a second condition. In an exemplary embodiment, the second condition may include one of a first sub-condition and a second sub-condition. In an exemplary embodiment, the first sub-condition may include at least two digits of the plurality of digits being different, at least one of the plurality of digits including one of 0x0 or 0xF, and each of the plurality of digits including one of the first hexadecimal digit, the second hexadecimal digit, a bitwise complement of the first hexadecimal digit, a bitwise complement of the second hexadecimal digit, 0x0, and 0xF. In an exemplary embodiment, the second sub-condition may include at least two digits of a plurality of negation-permutation-negation (NPN) digits being different, at least one of the plurality of NPN digits including one of 0x0 or 0xF, and each of the plurality of NPN digits including one of the first hexadecimal digit, the second hexadecimal digit, a bitwise complement of the first hexadecimal digit, a bitwise complement of the second hexadecimal digit, 0x0, and 0xF. In an exemplary embodiment, the plurality of NPN digits may be associated with an NPN Boolean function. In an exemplary embodiment, the NPN Boolean function may be obtained from the Boolean function.

An exemplary method may further include mapping the Boolean function to a first look-up table (LUT) of a first plurality of LUTs in the CLB. In an exemplary embodiment, the Boolean function may be mapped to the first LUT prior to mapping the Boolean function to the first PLC. In an exemplary embodiment, the Boolean function may be mapped to the first LUT responsive to the plurality of digits satisfying a third condition. In an exemplary embodiment, the third condition may include each of the plurality of digits being equal to a third hexadecimal digit.

An exemplary method may further include mapping the Boolean function to a second LUT of a second plurality of LUTs in the CLB responsive to the first condition, the second condition, and the third condition not being satisfied. In an exemplary embodiment, mapping the Boolean function to the first PLC may include mapping a plurality of inputs associated with the Boolean function to the first PLC. In an exemplary embodiment, a number of the first plurality of PLCs may be equal to 9N where N≥1. In an exemplary embodiment, mapping the plurality of inputs to the first PLC may include mapping a first input of the plurality of inputs to a $(1,3)^{th}$ input node of a third LUT, mapping a second input of the plurality of inputs to a $(2,3)^{th}$ input node of the third LUT, mapping a third input of the plurality of inputs to a selector input node of a multiplexer, mapping a fourth input of the plurality of inputs to a $(1,4)^{th}$ input node of a fourth LUT, mapping a fifth input of the plurality of inputs to a $(2,4)^{th}$ input node of the fourth LUT, mapping the fourth input to a $(1,5)^{th}$ input node of a fifth LUT, mapping the fifth input to a $(2,5)^{th}$ input node of the fifth LUT. An exemplary third LUT may be associated with the first PLC. In an exemplary embodiment, a third LUT output node of the third LUT may be connected to a $(1,1)^{th}$ XNOR input node of a first XNOR gate. An exemplary first XNOR gate maybe associated with the first PLC. An exemplary multiplexer may be associated with the first PLC. In an exemplary embodiment, a multiplexer output node of the multiplexer may be connected to a $(2,1)^{th}$ XNOR input node of the first XNOR gate. An exemplary fourth LUT may be associated with the first PLC. In an exemplary embodiment, a fourth LUT output node of the fourth LUT may be connected to a first multiplexer input node of the multiplexer. An exemplary fifth LUT may be associated with the first PLC. In an exemplary embodiment, a fifth LUT output node of the fifth LUT may be connected to a second multiplexer input node of the multiplexer.

In an exemplary embodiment, mapping the Boolean function to the second PLC may include mapping the plurality of inputs to the second PLC. In an exemplary embodiment, a number of the second plurality of PLCs may be equal to 6N. In an exemplary embodiment, mapping the plurality of inputs to the second PLC may include mapping the fourth input to a $(1,6)^{th}$ input node of a sixth LUT, mapping the fifth input to a $(2,6)^{th}$ input node of the sixth LUT, mapping the third input to a $(1,7)^{th}$ input node of a seventh LUT, mapping the second input to a $(2,7)^{th}$ input node of the seventh LUT, mapping the first input to a $(3,7)^{th}$ input node of the seventh LUT, mapping the third input to a $(1,8)^{th}$ input node of an eighth LUT, mapping the second input to a $(2,8)^{th}$ input node of the eighth LUT, mapping the first input to a $(3,8)^{th}$ input node of the eighth LUT. An exemplary sixth LUT may be associated with the second PLC. In an exemplary embodiment, a sixth LUT output node of the sixth LUT may be connected to a first NAND input node of a NAND gate. An exemplary NAND gate may be associated with the second PLC. An exemplary seventh LUT may be associated with the second PLC. In an exemplary embodiment, a seventh LUT output node of the seventh LUT may be connected to a second NAND input node of the NAND gate. In an exemplary embodiment, a NAND output node of the NAND gate may be connected to a $(1,2)^{th}$ XNOR input node of a second XNOR gate. In an exemplary second XNOR gate may be associated with the second PLC. An exemplary eighth LUT may be associated with the second PLC. In an exemplary embodiment, an eighth LUT output node of the eighth LUT may be connected to a $(2,2)^{th}$ XNOR input node of the second XNOR gate.

In an exemplary embodiment, mapping the Boolean function to the first LUT may include mapping the plurality of inputs to the first LUT. In an exemplary embodiment, a number of the first plurality of LUTs may be equal to 4N. In an exemplary embodiment, mapping the plurality of inputs to the first LUT may include mapping the fourth input to a $(1,1)^{th}$ input node of the first LUT and mapping the fifth input to a $(2,1)^{th}$ input node of the first LUT.

In an exemplary embodiment, mapping the Boolean function to the second LUT may include mapping the plurality of inputs to the second LUT. In an exemplary embodiment, a number of the second plurality of LUTs may be equal to N. In an exemplary embodiment, mapping the plurality of inputs to the second LUT may include mapping the first input to a $(1,2)^{th}$ input node of the second LUT, mapping the second input to a $(2,2)^{th}$ input node of the second LUT, mapping the third input to a $(3,2)^{th}$ input node of the second LUT, mapping the fourth input to a $(4,2)^{th}$ input node of the second LUT, and mapping the fifth input to a $(5,2)^{th}$ input node of the second LUT.

In an exemplary embodiment, the CLB may further include a first plurality of inverters, a second plurality of inverters, a third plurality of inverters, and a fourth plurality of inverters. In an exemplary embodiment, an output node of each inverter of the first plurality of inverters may be connected to a supply node of a respective PLC of the first plurality of PLCs. In an exemplary embodiment, an output node of each inverter of the second plurality of inverters may be connected to a supply node of a respective PLC of the second plurality of PLCs. In an exemplary embodiment, an output node of each inverter of the third plurality of inverters may be connected to a supply node of a respective LUT of the first plurality of LUTs. In an exemplary embodiment, an output node of each inverter of the fourth plurality of inverters may be connected to a supply node of a respective LUT of the second plurality of LUTs.

In an exemplary embodiment, the CLB may further include a first plurality of static random access memory (SRAM) cells, a second plurality of SRAM cells, a third plurality of SRAM cells, and a fourth plurality of SRAM cells. In an exemplary embodiment, each SRAM cell of the first plurality of SRAM cells may be connected to an input node of a respective inverter of the first plurality of inverters. In an exemplary embodiment, each SRAM cell of the first plurality of SRAM cells may be configured to activate a respective PLC of the first plurality of PLCs utilizing a respective inverter of the first plurality of inverters. In an exemplary embodiment, each SRAM cell of the second plurality of SRAM cells may be connected to an input node of a respective inverter of the second plurality of inverters. In an exemplary embodiment, each SRAM cell of the second plurality of SRAM cells may be configured to activate a respective PLC of the second plurality of PLCs utilizing a respective inverter of the second plurality of inverters. In an exemplary embodiment, each SRAM cell of the third plurality of SRAM cells may be connected to an input node of a respective inverter of the third plurality of inverters. In an exemplary embodiment, each SRAM cell of the third plurality of SRAM cells may be configured to activate a respective LUT of the first plurality of LUTs utilizing a respective inverter of the third plurality of inverters. In an exemplary embodiment, each SRAM cell of the fourth plurality of SRAM cells may be connected to an input node of a respective inverter of the fourth plurality of inverters. In an exemplary embodiment, each SRAM cell of the fourth plurality of SRAM cells may be configured to activate a respective LUT of the second plurality of LUTs utilizing a respective inverter of the fourth plurality of inverters.

Other exemplary systems, methods, features and advantages of the implementations will be, or will become, apparent to one of ordinary skill in the art upon examination of the following figures and detailed description. It is intended that all such additional systems, methods, features and advantages be included within this description and this summary, be within the scope of the implementations, and be protected by the claims herein.

BRIEF DESCRIPTION OF THE DRAWINGS

The drawing figures depict one or more implementations in accord with the present teachings, by way of example

DETAILED DESCRIPTION

Figure 1A:
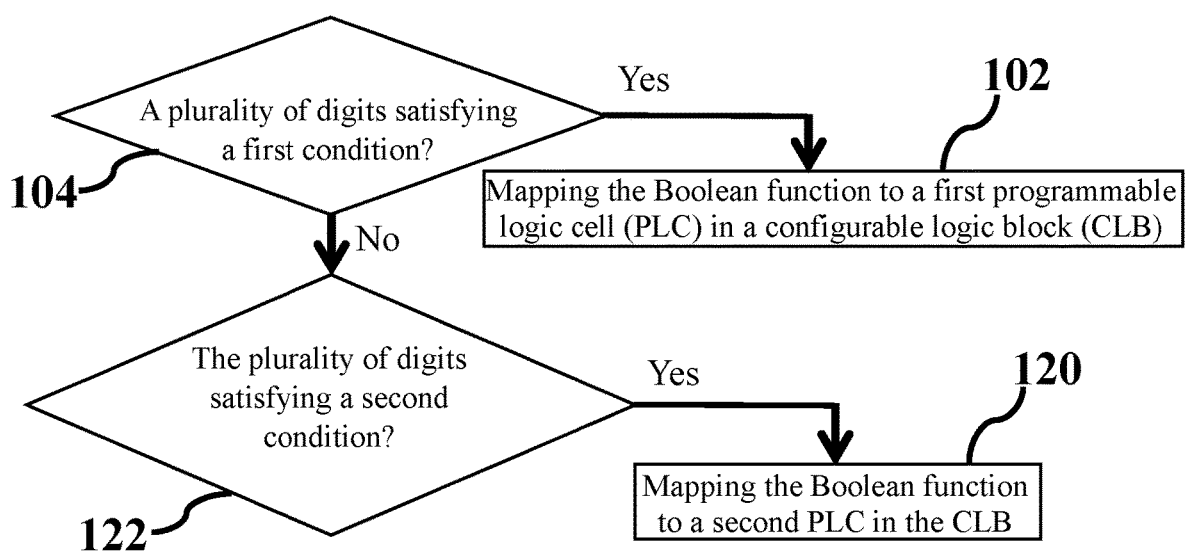
FIG. 1A shows a flowchart of a first implementation of a method for mapping a Boolean function to a configurable logic block, consistent with one or more exemplary embodiments of the present disclosure.

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

The following detailed description is presented to enable a person skilled in the art to make and use the methods and devices disclosed in exemplary embodiments of the present disclosure. For purposes of explanation, specific nomenclature is set forth to provide a thorough understanding of the present disclosure. However, it will be apparent to one skilled in the art that these specific details are not required to practice the disclosed exemplary embodiments. Descriptions of specific exemplary embodiments are provided only as representative examples. Various modifications to the exemplary implementations will be readily apparent to one skilled in the art, and the general principles defined herein may be applied to other implementations and applications without departing from the scope of the present disclosure. The present disclosure is not intended to be limited to the implementations shown, but is to be accorded the widest possible scope consistent with the principles and features disclosed herein.

Herein is disclosed an exemplary method for classification of Boolean functions and mapping each class to a respective logic cell of a configurable logic block (CLB) in a field-programmable gate array (FPGA). An exemplary method may classify a database of Boolean functions in four classes. An exemplary first class may include Boolean functions with a single hexadecimal digit presenting in a hexadecimal representation of Boolean functions. An exemplary second class may include Boolean functions with two different hexadecimal digits presenting in the hexadecimal representation. An exemplary second class may further include Boolean functions with a bitwise complement of each of two different hexadecimal digits in addition to each of two different hexadecimal digits in the hexadecimal representation. An exemplary third class may include Boolean functions similar to the second class as well as a 0x0 and/or a 0xF hexadecimal digit in the hexadecimal representation. Moreover, in an exemplary embodiment, when a negation-permutation-negation version of the Boolean function is classified in the third class, the third class may include the Boolean function as well. An exemplary fourth class may include remaining Boolean functions in database that are not classified in the first class, the second class, or the third class, i.e., any other Boolean function that may not be classified in the first class, the second class, and the third class.

A Boolean function with five inputs may be conventionally implemented by a 5-input look-up table (LUT). An exemplary 5-input LUT may require 32 static random access memory (SRAM) cells as well as 31 2-input multiplexers to implement the Boolean function. As a result, a large amount of resources may be dedicated to 5-input LUTs. To reduce an inefficient resource utilization, some features of the Boolean function may be leveraged to simplify a logic cell structure for implementing the Boolean function. In doing so, an exemplary class of Boolean functions may be mapped to a respective logic cell in the CLB with one or more LUTs. In an exemplary embodiment, LUTs in each logic cell may include a lower number of inputs than a number of inputs in 5-input LUTs. Exemplary logic cells of the first class, the second class, and the third class may include respective LUTs with two or three inputs. As a result, a number of SRAM cells required for implementing Boolean functions may be smaller than 32 SRAM cells. Consequently, a capacity of implementing Boolean functions in the FPGA may be increased.

FIG. 1A shows a flowchart of a first implementation of a method for mapping a Boolean function to a configurable logic block (CLB), consistent with one or more exemplary embodiments of the present disclosure. An exemplary method 100A may include a first implementation of a method for mapping a Boolean function to a CLB. In an exemplary embodiment, method 100A may include mapping a Boolean function to a first programmable logic cell (PLC) of a first plurality of PLCs in a CLB (step 102) responsive to a plurality of digits satisfying a first condition (step 104, Yes).

Figure 2A:
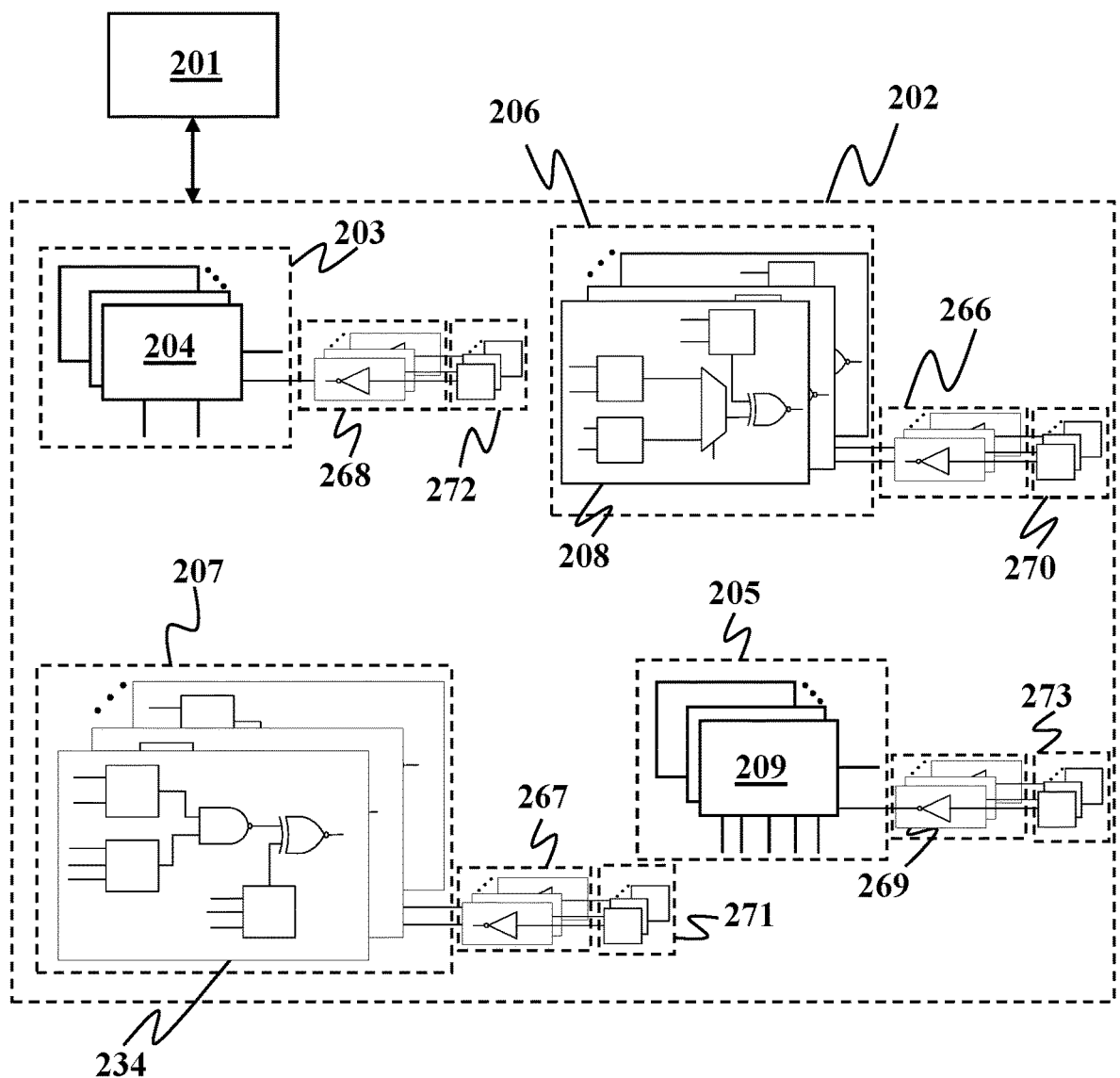
FIG. 2A shows a schematic of a system for mapping a Boolean function to a configurable logic block, consistent with one or more exemplary embodiments of the present disclosure.

FIG. 2A shows a schematic of a system for mapping a Boolean function to a CLB, consistent with one or more exemplary embodiments of the present disclosure. In an exemplary embodiment, different steps of method 100A may be implemented utilizing a system 200. In an exemplary embodiment, system 200 may include a processor 201 and a CLB 202. In an exemplary embodiment, the Boolean function may be mapped to CLB 202 utilizing processor 201. In an exemplary embodiment, CLB 202 may include a first plurality of look-up tables (LUTs) 203. In an exemplary embodiment, first plurality of LUTs 203 may include a first LUT 204. In an exemplary embodiment, CLB 202 may further include a second plurality of LUTs 205, a first plurality of PLCs 206 and a second plurality of PLCs 207. In an exemplary embodiment, first plurality of PLCs 206 may include a first PLC 208. In an exemplary embodiment, a second plurality of LUTs 205 may include a second LUT 209.

In an exemplary embodiment, a number of first plurality of PLCs 206 may be equal to 9N where N≥1. In an exemplary embodiment, the number of first plurality of PLCs 206 may be determined such that a ratio of an area occupied by first plurality of PLCs 206 to an area of CLB 202 is equal to a ratio of a number of Boolean functions mapped to first plurality of PLCs 206 to a number of Boolean functions in a database of Boolean functions. An exemplary database of Boolean functions may include all Boolean functions to be mapped to CLB 202.

Figure 3:
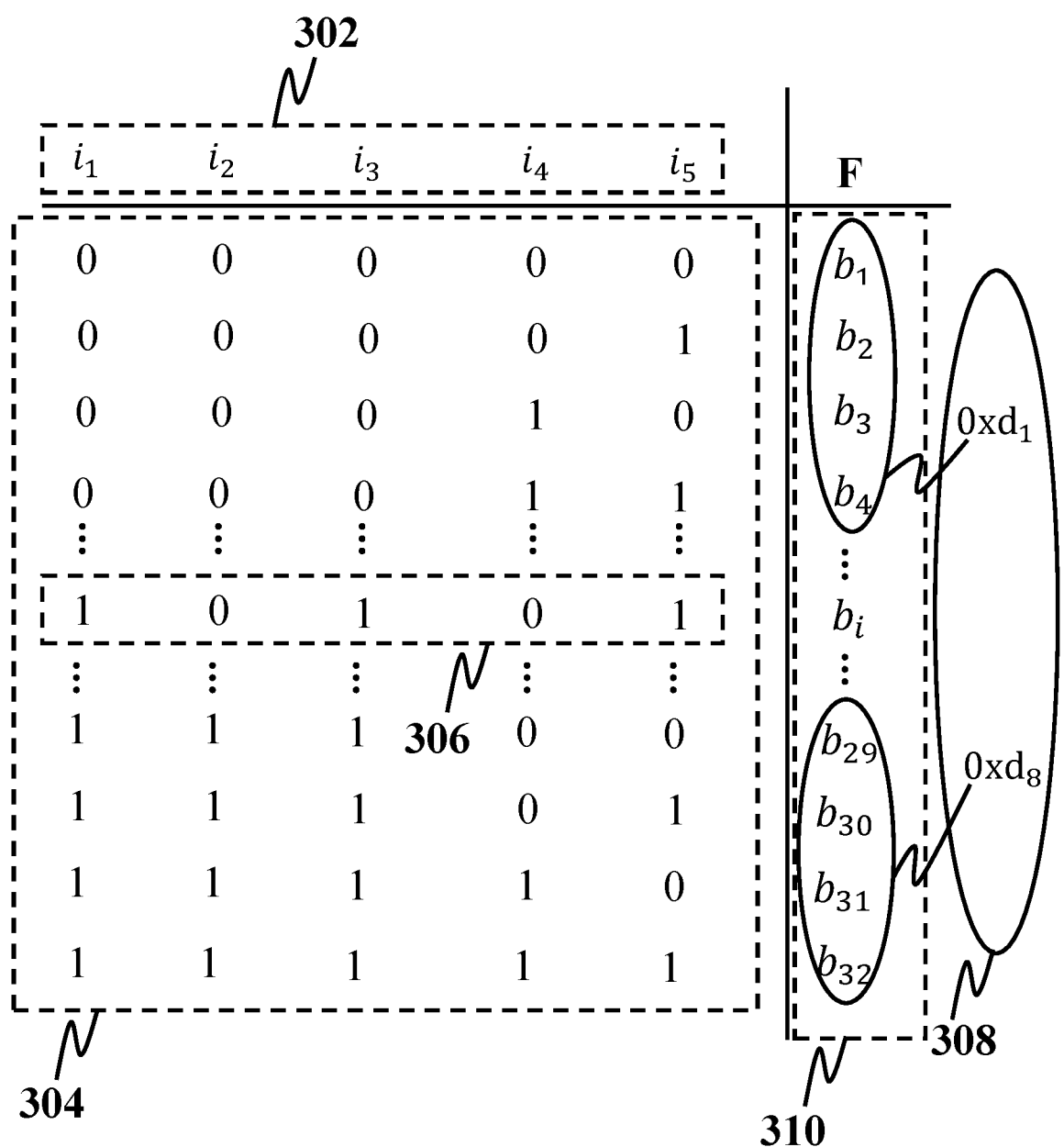
FIG. 3 shows a Boolean function, consistent with one or more exemplary embodiments of the present disclosure.

FIG. 3 shows a Boolean function, consistent with one or more exemplary embodiments of the present disclosure. In an exemplary embodiment, a Boolean function F may include a plurality of inputs 302. In an exemplary embodiment, plurality of inputs 302 may include a plurality of combinations 304. In an exemplary embodiment, a number of plurality of combinations may be equal to 32. In an $i^{th}$ combination 306 of plurality of combinations 304, each respective input of plurality of inputs 302 may include a 0 value or a 1 value. An exemplary Boolean function F may generate an output $b_i$ for $i^{th}$ combination 306. An exemplary output $b_i$ may include a 0 value or a 1 value. An exemplary Boolean function F may be represented by a plurality of digits 308. In an exemplary embodiment, a number of plurality of digits 308 may be equal to 8. In an exemplary embodiment, a $j^{th}$ digit $d_j$ of plurality of digits 308 may include a hexadecimal value where 1≤j≤8. In an exemplary embodiment, $j^{th}$ digit $d_j$ may include an output $b_m$, an output $b_{m+1}$, an output $b_{m+2}$, and an output $b_{m+3}$ output where m=4(j−1)+1.

In an exemplary embodiment, implementing a Boolean function of K inputs may require a K-input LUT. In doing so, a number of $2^K$ static random access memory (SRAM) cells may be required to store $2^K$ outputs of the Boolean function. In other words, the K-input LUT may implement a $2^K$-input multiplexer including K selector inputs. Each input of the plurality of inputs may be fed to a respective selector input of selector inputs. The plurality of inputs may determine an address of a SRAM cell of the plurality of SRAM cells and the $2^K$-input multiplexer may route the stored bit in the SRAM cell to an output of the $2^K$-input LUT. A $2^K$-input multiplexer may be implemented utilizing $2^K−1$ 2-input multiplexers. As a result, a number of required 2-input multiplexers may exponentially increase with number of the plurality of inputs. On the other hand, a number of required SRAM cells may exponentially increase with number of the plurality of inputs. Moreover, a larger number of plurality of inputs may lead to an excessive increase in a total delay and a power consumption of LUTs.

In an exemplary embodiment, a Boolean function may be implemented by LUTs with a number of inputs lower than a number of Boolean function's inputs when the plurality of inputs include correlations. As a result, the Boolean function may be implemented by lower number of SRAM cells, power consumption, and delay.

Figure 1B:
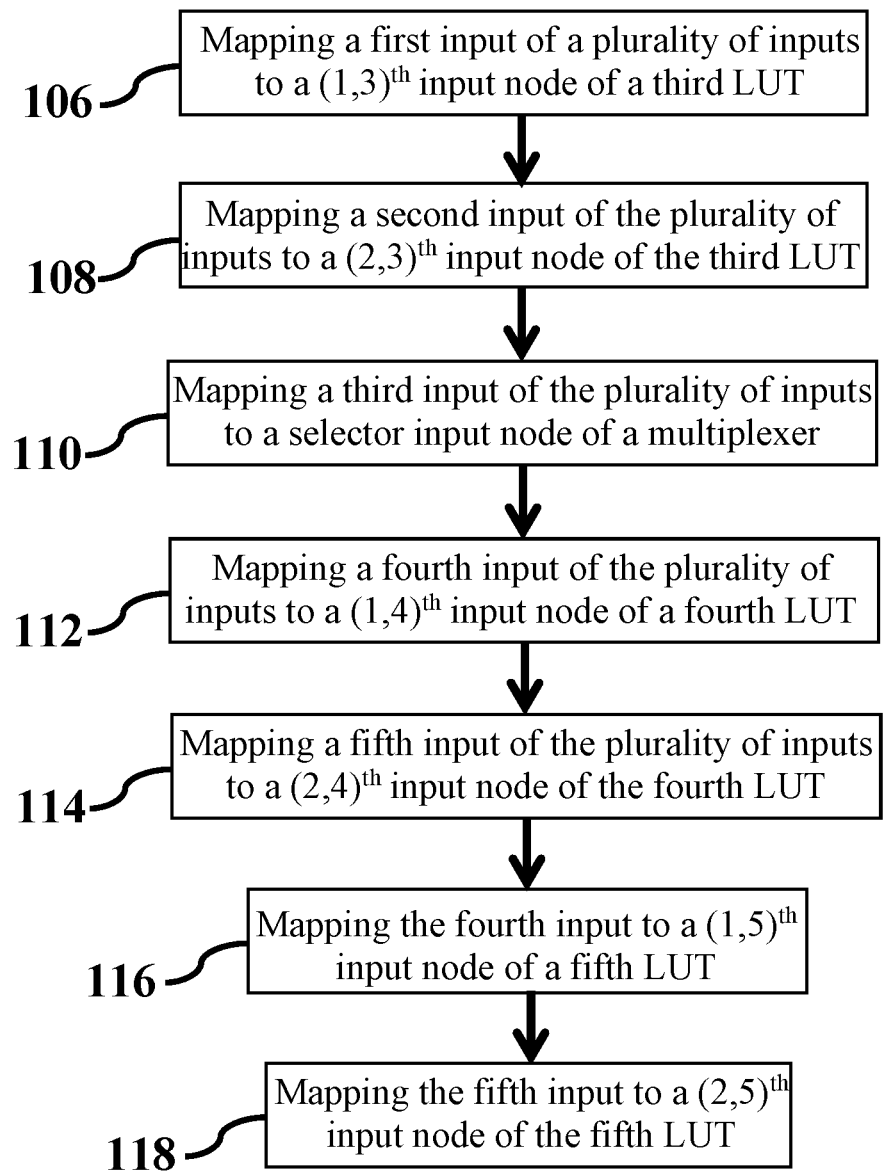
FIG. 1B shows a flowchart of a method for mapping a plurality of inputs to a first programmable logic cell, consistent with one or more exemplary embodiments of the present disclosure.

In an exemplary embodiment, step 102 may include mapping Boolean function F to first PLC 208. In an exemplary embodiment, mapping Boolean function F to first PLC 208 may include mapping plurality of inputs 302 to first PLC 208. FIG. 1B shows a flowchart of a method for mapping a plurality of inputs to a first PLC, consistent with one or more exemplary embodiments of the present disclosure. Specifically, FIG. 1B provides details of step 102. In an exemplary embodiment, mapping plurality of inputs 302 to first PLC 208 may include mapping a first input of plurality of inputs 302 to a $(1,3)^{th}$ input node of a third LUT (step 106), mapping a second input of plurality of inputs 302 to a $(2,3)^{th}$ input node of the third LUT (step 108), mapping a third input of plurality of inputs 302 to a selector input node of a multiplexer (step 110), mapping a fourth input of plurality of inputs 302 to a $(1,4)^{th}$ input node of a fourth LUT (step 112), mapping a fifth input of plurality of inputs 302 to a $(2,4)^{th}$ input node of the fourth LUT (step 114), mapping the fourth input to a $(1,5)^{th}$ input node of a fifth LUT (step 116), mapping the fifth input to a $(2,5)^{th}$ input node of the fifth LUT (step 118).

Figure 2B:
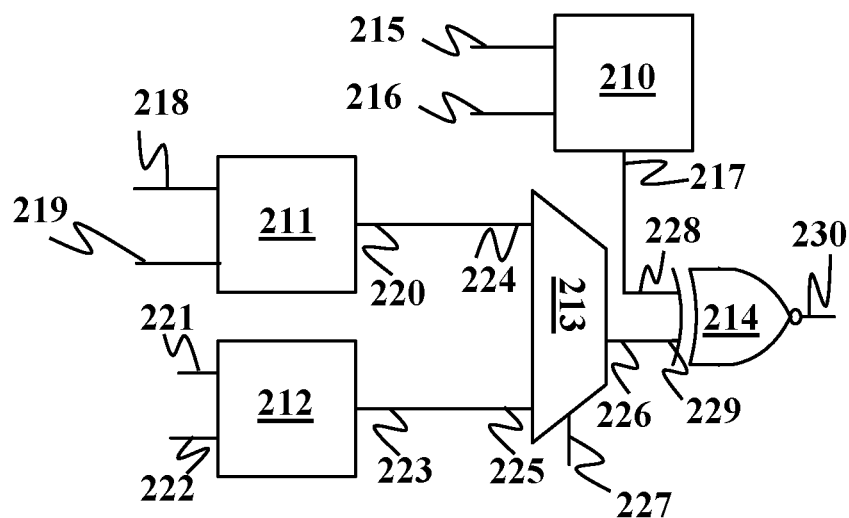
FIG. 2B shows a schematic of a first programmable logic cell, consistent with one or more exemplary embodiments of the present disclosure.

FIG. 2B shows a schematic of a first PLC, consistent with one or more exemplary embodiments of the present disclosure. In an exemplary embodiment, first plurality of PLCs 206 may include a first PLC 208. An exemplary first PLC 208 may include a third LUT 210, a fourth LUT 211, a fifth LUT 212, a multiplexer 213, and a first XNOR gate 214. In an exemplary embodiment, third LUT 210 may include a $(1,3)^{th}$ input node 215, a $(2,3)^{th}$ input node 216, and a third LUT output node 217. In an exemplary embodiment, fourth LUT 211 may include a $(1,4)^{th}$ input node 218, a $(2,4)^{th}$ input node 219, and a fourth LUT output node 220. In an exemplary embodiment, fifth LUT 212 may include a $(1,5)^{th}$ input node 221, a $(2,5)^{th}$ input node 222, and a fifth LUT output node 223. An exemplary multiplexer 213 may include a first multiplexer input node 224, a second multiplexer input node 225, a multiplexer output node 226, and a selector input node 227. In an exemplary embodiment, first multiplexer input node 224 may be connected to fourth LUT output node 220. In an exemplary embodiment, second multiplexer input node 225 may be connected to fifth LUT output node 223. An exemplary first XNOR gate 214 may include a $(1,1)^{th}$ XNOR input node 228, a $(2,1)^{th}$ XNOR input node 229, and a first XNOR output node 230. In an exemplary embodiment, $(1,1)^{th}$ XNOR input node 228 may be connected to third LUT output node 217. In an exemplary embodiment, $(2,1)^{th}$ XNOR input node 229 may be connected to multiplexer output node 226.

Referring to FIGS. 1B, 2B and 3, in an exemplary embodiment, step 106 may include mapping a first input $i_1$ of plurality of inputs 302 to $(1,3)^{th}$ input node 215. In an exemplary embodiment, mapping first input $i_1$ to $(1,3)^{th}$ input node 215 may include configuring processor 201 to feed first input $i_1$ to $(1,3)^{th}$ input node 215. In an exemplary embodiment, step 108 may include mapping a second input $i_2$ of plurality of inputs 302 to $(2,3)^{th}$ input node 216. In an exemplary embodiment, mapping second input $i_2$ to $(2,3)^{th}$ input node 216 may include configuring processor 201 to feed second input $i_2$ to $(2,3)^{th}$ input node 216. In an exemplary embodiment, step 110 may include mapping a third input $i_3$ of plurality of inputs 302 to selector input node 227. In an exemplary embodiment, mapping third input $i_3$ to selector input node 227 may include configuring processor 201 to feed third input $i_3$ to selector input node 227. In an exemplary embodiment, step 112 may include mapping a fourth input $i_4$ of plurality of inputs 302 to $(1,4)^{th}$ input node 218. In an exemplary embodiment, mapping fourth input $i_4$ to $(1,4)^{th}$ input node 218 may include configuring processor 201 to feed fourth input $i_4$ to $(1,4)^{th}$ input node 218. In an exemplary embodiment, step 114 may include mapping a fifth input $i_5$ of plurality of inputs 302 to $(2,4)^{th}$ input node 219. In an exemplary embodiment, mapping fifth input $i_5$ to $(2,4)^{th}$ input node 219 may include configuring processor 201 to feed fifth input $i_5$ to $(2,4)^{th}$ input node 219. In an exemplary embodiment, step 116 may include mapping fourth input $i_4$ to $(1,5)^{th}$ input node 221. In an exemplary embodiment, mapping fourth input $i_4$ to $(1,5)^{th}$ input node 221 may include configuring processor 201 to feed fourth input $i_4$ to $(1,5)^{th}$ input node 221. In an exemplary embodiment, step 118 may include mapping fifth input $i_5$ to $(2,5)^{th}$ input node 222. In an exemplary embodiment, mapping fifth input $i_5$ to $(2,5)^{th}$ input node 222 may include configuring processor to feed fifth input $i_5$ to $(2,5)^{th}$ input node 222.

For further detail regarding step 104, in an exemplary embodiment, plurality of digits 308 may satisfy the first condition. In an exemplary embodiment the first condition may include at least two digits of plurality of digits 308 being different and each of plurality of digits 308 including one of a first hexadecimal digit, a second hexadecimal digit different from the first hexadecimal digit, a bitwise complement of the first hexadecimal digit, and a bitwise complement of the second hexadecimal digit. In an exemplary embodiment, bitwise complement of a hexadecimal digit may be obtained by complementing each bit of a binary representation of the hexadecimal digit, that is, by turning each 0 bit of the binary representation to a respective 1 bit and turning each 1 bit of the binary representation to a respective 0 bit. In an exemplary embodiment, the first hexadecimal digit may include 0x6 and the second hexadecimal digit may include 0xA. As a result, an exemplary Boolean function 0x6A6A6A6A may satisfy the first condition. Moreover, since a bitwise complement of 0x6 is 0x9 and a bitwise complement of 0xA is 0x5, an exemplary Boolean function 0x956A6A6A may also satisfy the first condition.

In an exemplary embodiment, Boolean function F may require $2^5=32$ SRAM cells to be implemented by a 5-input LUT. An exemplary first PLC 208 may include three 2-input LUTs. As a result, when plurality of digits 308 satisfy the first condition, first PLC 208 may require $3\times2^2=12$ SRAM cells to implement Boolean function F. Moreover, first PLC 208 may be implemented by 10 2-input multiplexers. In contrast, a 5-input LUT may be implemented by 31 2-input multiplexers.

Exemplary method 100A may further include mapping Boolean function F to a second PLC of a second plurality of PLCs in CLB 202 (step 120) responsive to plurality of digits 308 satisfying a second condition (step 122, Yes). Referring to FIG. 2A, in an exemplary embodiment, CLB 202 may include second plurality of PLCs 207. In an exemplary embodiment, second plurality of PLCs 207 may include a second PLC 234. In an exemplary embodiment, a number of second plurality of PLCs 207 may be equal to 6N. In an exemplary embodiment, mapping Boolean function F to second PLC 234 may include mapping plurality of inputs 302 to second PLC 234.

In an exemplary embodiment, a number of second plurality of PLCs 207 may be equal to 6N. In an exemplary embodiment, the number of second plurality of PLCs 207 may be determined such that a ratio of an area occupied by second plurality of PLCs 207 to an area of CLB 202 is equal to a ratio of a number of Boolean functions mapped to second plurality of PLCs 207 to a number of Boolean functions in the database of Boolean functions.

Figure 1C:
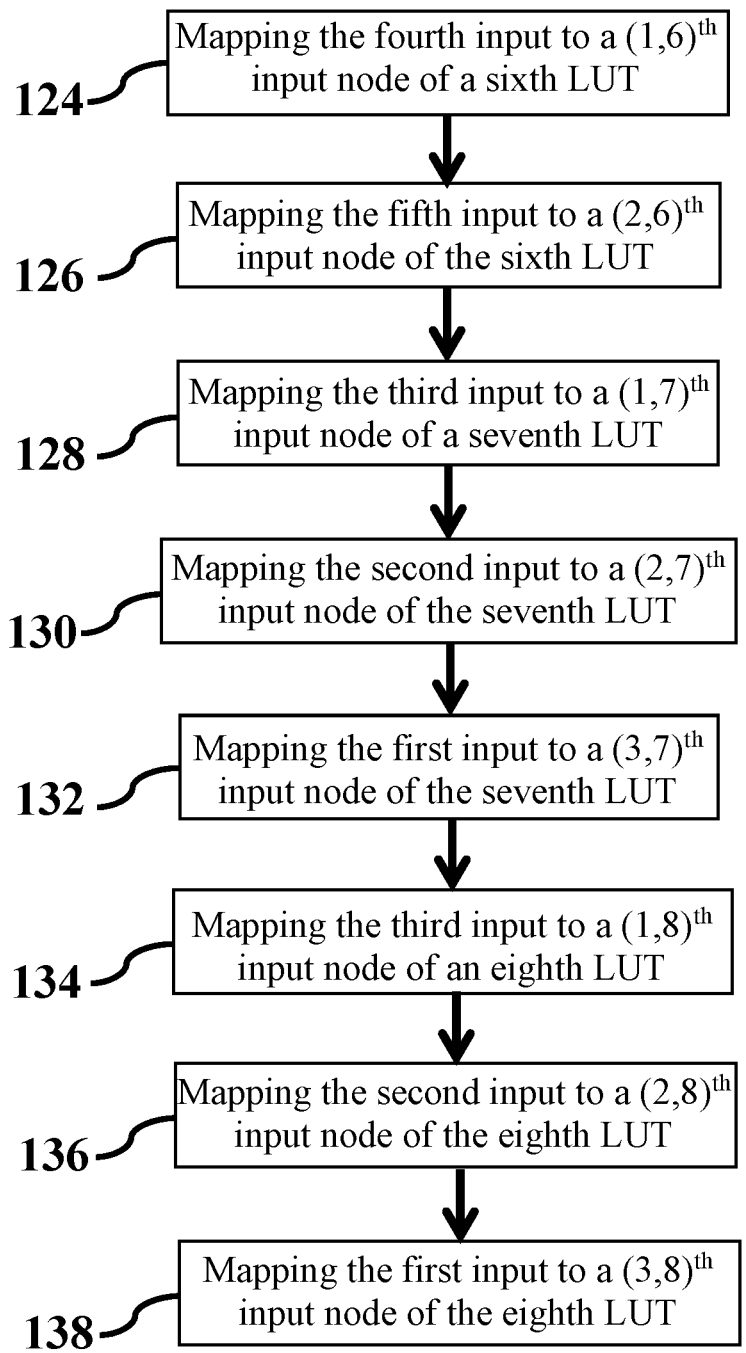
FIG. 1C shows a flowchart of a method for mapping a plurality of inputs to a second programmable logic cell, consistent with one or more exemplary embodiments of the present disclosure.

FIG. 1C shows a flowchart of a method for mapping a plurality of inputs to a second PLC, consistent with one or more exemplary embodiments of the present disclosure. In an exemplary embodiment, FIG. 1C provides exemplary details of step 120. In an exemplary embodiment, mapping plurality of inputs 302 to second PLC 234 may include mapping the fourth input to a $(1,6)^{th}$ input node of a sixth LUT (step 124), mapping the fifth input to a $(2,6)^{th}$ input node of the sixth LUT (step 126), mapping the third input to a $(1,7)^{th}$ input node of a seventh LUT (step 128), mapping the second input to a $(2,7)^{th}$ input node of the seventh LUT (step 130), mapping the first input to a $(3,7)^{th}$ input node of the seventh LUT (step 132), mapping the third input to a $(1,8)^{th}$ input node of an eighth LUT (step 134), mapping the second input to a $(2,8)^{th}$ input node of the eighth LUT (step 136), mapping the first input to a $(3,8)^{th}$ input node of the eighth LUT (step 138).

Figure 2C:
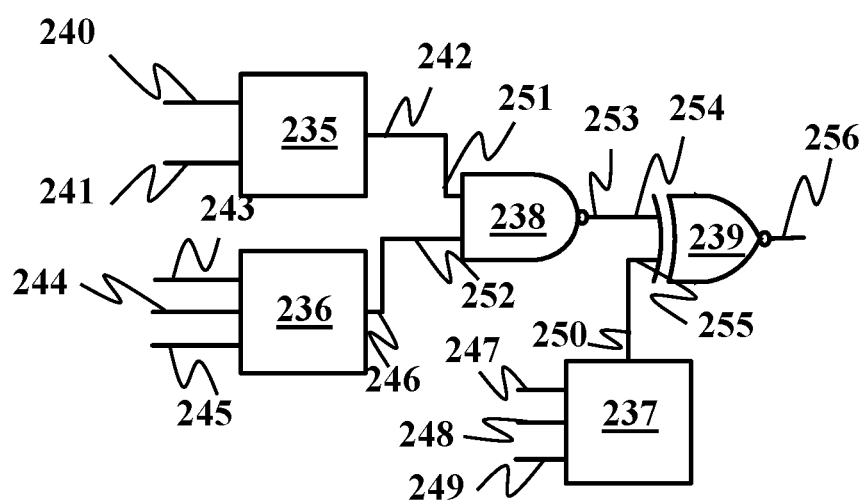
FIG. 2C shows a schematic of a second programmable logic cell, consistent with one or more exemplary embodiments of the present disclosure.

FIG. 2C shows a schematic of a second PLC, consistent with one or more exemplary embodiments of the present disclosure. In an exemplary embodiment, second PLC 234 may include a sixth LUT 235, a seventh LUT 236, an eighth LUT 237, a NAND gate 238, and a second XNOR gate 239. An exemplary sixth LUT 235 may include a $(1,6)^{th}$ input node 240, a $(2,6)^{th}$ input node 241, and a sixth LUT output node 242. An exemplary seventh LUT 236 may include a $(1,7)^{th}$ input node 243, a $(2,7)^{th}$ input node 244, a $(3,7)^{th}$ input node 245, and a seventh LUT output node 246. An exemplary eighth LUT 237 may include a $(1,8)^{th}$ input node 247, a $(2,8)^{th}$ input node 248, a $(3,8)^{th}$ input node 249, and an eighth LUT output node 250. An exemplary NAND gate 238 may include a first NAND input node 251, a second NAND input node 252, a NAND output node 253. In an exemplary embodiment, first NAND input node 251 may be connected to sixth LUT output node 242. In an exemplary embodiment, second NAND input node 252 may be connected to seventh LUT output node 246. An exemplary second XNOR gate 239 may include a $(1,2)^{th}$ XNOR input node 254, a $(2,2)^{th}$ XNOR input node 255, and a second XNOR output node 256. In an exemplary embodiment, $(1,2)^{th}$ XNOR input node 254 may be connected to NAND output node 253. In an exemplary embodiment, $(2,2)^{th}$ XNOR input node 255 may be connected to eighth LUT output node 250.

Referring to FIGS. 1C and 2C, in an exemplary embodiment, step 124 may include mapping fourth input $i_4$ to $(1,6)^{th}$ input node 240. In an exemplary embodiment, mapping fourth input $i_4$ to $(1,6)^{th}$ input node 240 may include configuring processor 201 to feed fourth input $i_4$ to $(1,6)^{th}$ input node 240. In an exemplary embodiment, step 126 may include mapping fifth input $i_5$ to $(2,6)^{th}$ input node 241. In an exemplary embodiment, mapping fifth input $i_5$ to $(2,6)^{th}$ input node 241 configuring processor 201 to feed fifth input $i_5$ to $(2,6)^{th}$ input node 241. In an exemplary embodiment, step 128 may include mapping third input $i_3$ to $(1,7)^{th}$ input node 243. In an exemplary embodiment, mapping third input $i_3$ to $(1,7)^{th}$ input node 243 configuring processor 201 to feed third input $i_3$ to $(1,7)^{th}$ input node 243. In an exemplary embodiment, step 130 may include mapping second input $i_2$ to $(2,7)^{th}$ input node 244. In an exemplary embodiment, mapping second input $i_2$ to $(2,7)^{th}$ input node 244 may include configuring processor 201 to feed second input $i_2$ to $(2,7)^{th}$ input node 244. In an exemplary embodiment, step 132 may include mapping first input $i_1$ to a $(3,7)^{th}$ input node 245. In an exemplary embodiment, mapping first input $i_1$ to a $(3,7)^{th}$ input node 245 may include configuring processor 201 to feed first input $i_1$ to a $(3,7)^{th}$ input node 245. In an exemplary embodiment, step 134 may include mapping third input $i_3$ to $(1,8)^{th}$ input node 247. In an exemplary embodiment, mapping third input $i_3$ to $(1,8)^{th}$ input node 247 may include configuring processor 201 to feed third input $i_3$ to $(1,8)^{th}$ input node 247. In an exemplary embodiment, step 136 may include mapping second input $i_2$ to $(2,8)^{th}$ input node 248. In an exemplary embodiment, mapping second input $i_2$ to $(2,8)^{th}$ input node 248 may include configuring processor 201 to feed second input $i_2$ to $(2,8)^{th}$ input node 248. In an exemplary embodiment, step 138 may include mapping first input $i_1$ to $(3,8)^{th}$ input node 249. In an exemplary embodiment, mapping first input $i_1$ to $(3,8)^{th}$ input node 249 may include configuring processor 201 to feed first input $i_1$ to $(3,8)^{th}$ input node 249.

For further detail regarding step 122, in an exemplary embodiment, plurality of digits 308 may satisfy the second condition. In an exemplary embodiment, the second condition may include one of a first sub-condition and a second sub-condition. In an exemplary embodiment, the first sub-condition may include at least two digits of plurality of digits 308 being different, at least one of plurality of digits 308 including one of 0x0 or 0xF, and each of plurality of digits 308 including one of the first hexadecimal digit, the second hexadecimal digit, a bitwise complement of the first hexadecimal digit, a bitwise complement of the second hexadecimal digit, 0x0, and 0xF. In an exemplary embodiment, the first hexadecimal digit may include 0x6 and the second hexadecimal digit may include 0xA. As a result, an exemplary Boolean function 0x6560FA6F may satisfy the first sub-condition. In an exemplary embodiment, the second sub-condition may include at least two digits of a plurality of negation-permutation-negation (NPN) digits being different, at least one of the plurality of NPN digits including one of 0x0 or 0xF, and each of the plurality of NPN digits including one of the first hexadecimal digit, the second hexadecimal digit, a bitwise complement of the first hexadecimal digit, a bitwise complement of the second hexadecimal digit, 0x0, and 0xF. In an exemplary embodiment, the plurality of NPN digits may be associated with an NPN Boolean function. In an exemplary embodiment, the NPN Boolean function may be obtained from the Boolean function.

Referring to FIG. 3, in an exemplary embodiment, an NPN operation may generate a plurality of NPN digits by complementing a subset of plurality of inputs 302, permuting plurality of inputs 302, and complementing a subset of a plurality of Boolean outputs 310. In an exemplary embodiment, plurality of inputs 302 may be ordered in a first order. In an exemplary embodiment, permuting plurality of inputs 302 may include reordering plurality of inputs 302 in a second order. In an exemplary embodiment, the second order may include any order different from the first order. In an exemplary embodiment, by complementing each subset of plurality of inputs 302 a respective NPN Boolean function with a respective plurality of NPN digits may be generated.

In an exemplary embodiment, complementing a subset of plurality of inputs 302 may include complementing each input of the subset, that is, turning each 0 bit of the subset to a respective 1 bit and turning each 1 bit of the subset to a respective 0 bit. In an exemplary embodiment, by applying each permutation on plurality of inputs 302, a respective NPN Boolean function with a respective plurality of NPN digits may be generated. In an exemplary embodiment, by complementing each subset of plurality of Boolean outputs 310, a respective NPN Boolean function with a respective plurality of NPN digits may be generated. In an exemplary embodiment, complementing a subset of plurality of Boolean outputs 310 may include complementing each output $b_i$ in the subset, that is, turning output $b_i$ to 1 when output $b_i$ includes 0 value and turning output $b_i$ to 0 when output $b_i$ includes 1 value. Therefore, a plurality of NPN Boolean functions corresponding with Boolean function F may be generated. In an exemplary embodiment, when plurality of digits 302 does not satisfy the first sub-condition, Boolean function F may not be mapped to second PLC 234. However, by performing an NPN operation, the plurality of NPN digits may satisfy the second sub-condition. Therefore, Boolean function F may be mapped to second PLC 234. As a result, a probability of mapping Boolean function F to second PLC 234 may increase.

Figure 1D:
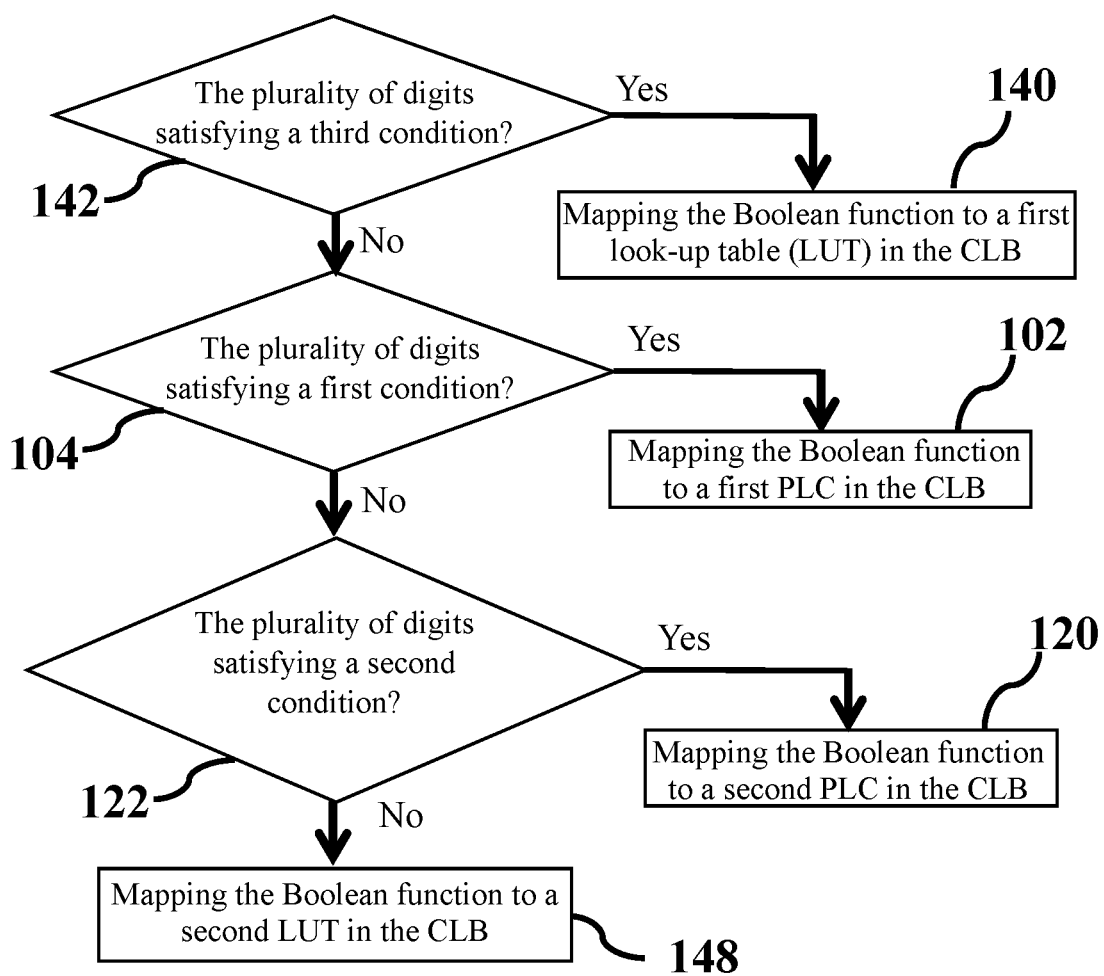
FIG. 1D shows a flowchart of a second implementation of a method for mapping a Boolean function to a configurable logic block, consistent with one or more exemplary embodiment of the present disclosure.

FIG. 1D shows a flowchart of a second implementation of a method for mapping a Boolean function to a CLB, consistent with one or more exemplary embodiment of the present disclosure. An exemplary method 100B may include a second implementation of a method for mapping Boolean function F to CLB 202. In an exemplary embodiment, FIG. 1D provides exemplary details of method 100B. In an exemplary embodiment, method 100B may include steps of method 100A. In an exemplary embodiment, method 100B may further include mapping Boolean function F to a first LUT 204 (step 140) responsive to plurality of digits 308 satisfying a third condition (step 142, Yes). In an exemplary embodiment, Boolean function F may be mapped to first LUT 204 prior to mapping Boolean function F to first PLC 208. In an exemplary embodiment, a number of first plurality of LUTs 203 may be equal to 4N. In an exemplary embodiment, mapping Boolean function F to first LUT 204 may include mapping plurality of inputs 302 to first LUT 204.

In an exemplary embodiment, a number of first plurality of LUTs 203 may be equal to 4N. In an exemplary embodiment, the number of first plurality of LUTs 203 may be determined such that a ratio of an area occupied by first plurality of LUTs 203 to an area of CLB 202 is equal to a ratio of a number of Boolean functions mapped to first plurality of PLCs 203 to a number of Boolean functions in the database of Boolean functions.

An exemplary second PLC 234 may include two 3-input LUTs and one 2-input LUT. As a result, when plurality of digits 308 satisfy the second condition, second PLC 234 may require $(2 \times 2^3) + 2^2 = 20$ SRAM cells to implement Boolean function F. Moreover, second PLC 234 may be implemented by 17 2-input multiplexers compared with 31 2-input multiplexers of a 5-input LUT.

Figure 1E:
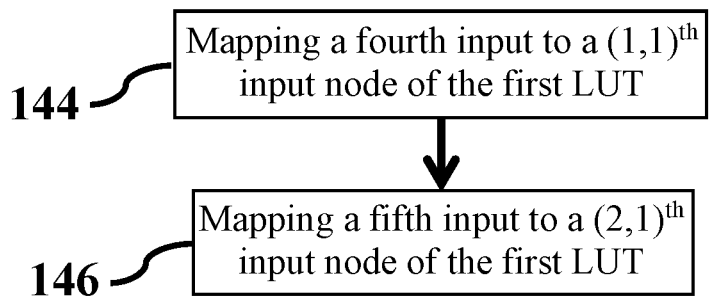
FIG. 1E shows a flowchart of a method for mapping a plurality of inputs to a first look-up table, consistent with one or more exemplary embodiments of the present disclosure.

FIG. 1E shows a flowchart of a method for mapping a plurality of inputs to a first LUT, consistent with one or more exemplary embodiments of the present disclosure. In an exemplary embodiment, FIG. 1E provides exemplary details of step 140. In an exemplary embodiment, mapping plurality of inputs 302 to first LUT 204 may include mapping fourth input $i_4$ to a $(1,1)^{th}$ input node of first LUT 204 (step 144) and mapping fifth input $i_5$ to a $(2,1)^{th}$ input node of first LUT 204 (step 146).

Figure 2D:
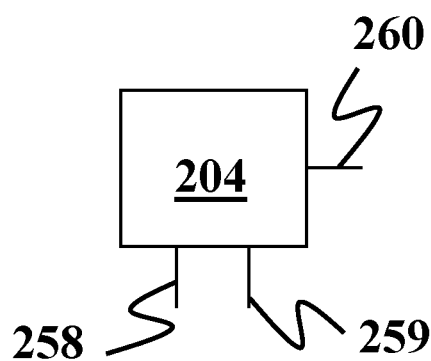
FIG. 2D shows a schematic of a first look-up table, consistent with one or more exemplary embodiments of the present disclosure.

FIG. 2D shows a schematic of a first LUT, consistent with one or more exemplary embodiments of the present disclosure. An exemplary first LUT 204 may include a $(1,1)^{th}$ input node 258, a $(2,1)^{th}$ input node 259 and a first LUT output node 260. Referring to FIGS. 1E and 2D, in an exemplary embodiment, step 144 may include mapping fourth input $i_4$ to $(1,1)^{th}$ input node 258. in an exemplary embodiment, mapping fourth input $i_4$ to $(1,1)^{th}$ input node 258 may include configuring processor 201 to feed fourth input $i_4$ to $(1,1)^{th}$ input node 258. In an exemplary embodiment, step 146 may include mapping fifth input $i_5$ to $(2,1)^{th}$ input node 259. In an exemplary embodiment, mapping fifth input $i_5$ to $(2,1)^{th}$ input node 259 may include configuring processor 201 to feed fifth input $i_5$ to $(2,1)^{th}$ input node 259.

In further detail with respect to step 142, in an exemplary embodiment, the third condition may include each of plurality of digits 308 being equal to a third hexadecimal digit. In an exemplary embodiment, the third hexadecimal digit may include 0x6. As a result, an exemplary Boolean function 0x66666666 may satisfy the third condition. In an exemplary embodiment, when plurality of digits 308 include only the third hexadecimal digit, Boolean function F may be obtained by two input of plurality of inputs 302, i.e., fourth input $i_4$ and fifth input $i_5$. As a result, mapping fourth input $i_4$ and fifth input $i_5$ may be sufficient to implement Boolean function F.

Referring again to FIG. 1D, an exemplary method 100B may further include mapping Boolean function F to second LUT 209 (step 148) responsive to the first condition, the second condition, and the third condition not being satisfied (step 122, No). In an exemplary embodiment, mapping Boolean function F to second LUT 209 may include mapping plurality of inputs 302 to second LUT 209.

In an exemplary embodiment, a number of second plurality of LUTs 205 may be equal to N. In an exemplary embodiment, the number of second plurality of LUTs 205 may be determined such that a ratio of an area occupied by second plurality of LUTs 205 to the area of CLB 202 is equal to a ratio of a number of Boolean functions mapped to second plurality of LUTs 205 to a number of Boolean functions in the database of Boolean functions.

Figure 1F:
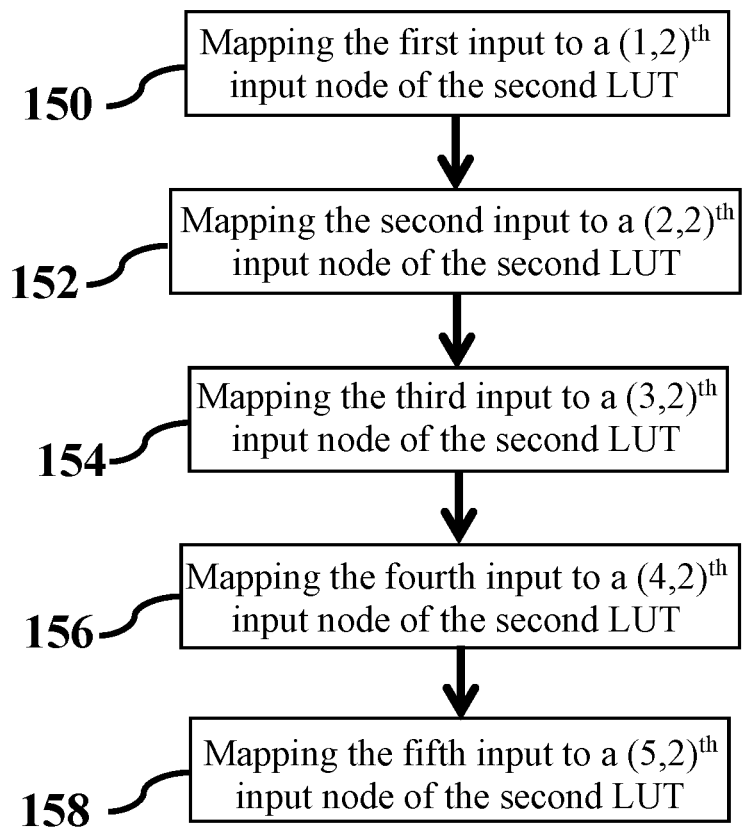
FIG. 1F shows a flowchart of a method for mapping a plurality of inputs to a second look-up table, consistent with one or more exemplary embodiments of the present disclosure.

FIG. 1F shows a flowchart of a method for mapping a plurality of inputs to a second LUT, consistent with one or more exemplary embodiments of the present disclosure. In an exemplary embodiment, FIG. 1F provides exemplary details of step 148. In an exemplary embodiment, mapping plurality of inputs 302 to second LUT 209 may include mapping the first input to a $(1,2)^{th}$ input node of second LUT 209 (step 150), mapping the second input to a $(2,2)^{th}$ input node of second LUT 209 (step 152), mapping the third input to a $(3,2)^{th}$ input node of second LUT 209 (step 154), mapping the fourth input to a $(4,2)^{th}$ input node of second LUT 209 (step 156), and mapping the fifth input to a $(5,2)^{th}$ input node of second LUT 209 (step 158).

Figure 2E:
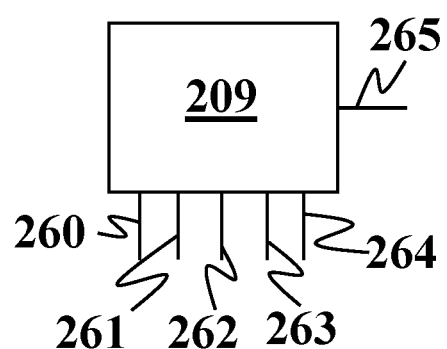
FIG. 2E shows a schematic of a second LUT, consistent with one or more exemplary embodiments of the present disclosure.

FIG. 2E shows a schematic of a second LUT, consistent with one or more exemplary embodiments of the present disclosure. In an exemplary embodiment, second LUT 209 may include a $(1,2)^{th}$ input node 260, a $(2,2)^{th}$ input node 261, a $(3,2)^{th}$ input node 262, a $(4,2)^{th}$ input node 263, a $(5,2)^{th}$ input node 264, and a second LUT output node 265. Referring to FIGS. 1F and 2E, in an exemplary embodiment, step 150 may include mapping first input $i_1$ to $(1,2)^{th}$ input node 260. In an exemplary embodiment, mapping first input $i_1$ to $(1,2)^{th}$ input node 260 may include configuring processor 201 to feed first input $i_1$ to $(1,2)^{th}$ input node 260. In an exemplary embodiment, step 152 may include mapping second input $i_2$ to $(2,2)^{th}$ input node 261. In an exemplary embodiment, mapping second input $i_2$ to $(2,2)^{th}$ input node 261 may include configuring processor 201 to feed second input $i_2$ to $(2,2)^{th}$ input node 261. In an exemplary embodiment, step 154 may include mapping third input $i_3$ to $(3,2)^{th}$ input node 262. In an exemplary embodiment, mapping third input $i_3$ to $(3,2)^{th}$ input node 262 may include configuring processor 201 to feed third input $i_3$ to $(3,2)^{th}$ input node 262. In an exemplary embodiment, step 156 may include mapping fourth input $i_4$ to $(4,2)^{th}$ input node 263. In an exemplary embodiment, mapping fourth input $i_4$ to $(4,2)^{th}$ input node 263 may include configuring processor 201 to feed fourth input $i_4$ to $(4,2)^{th}$ input node 263. In an exemplary embodiment, step 158 may include mapping fifth input $i_5$ to $(5,2)^{th}$ input node 264. In an exemplary embodiment, mapping fifth input $i_5$ to $(5,2)^{th}$ input node 264 may include configuring processor 201 to feed fifth input $i_5$ to $(5,2)^{th}$ input node 264.

Referring again to FIG. 2A, in an exemplary embodiment, CLB 202 may further include a first plurality of inverters 266, a second plurality of inverters 267, a third plurality of inverters 268, and a fourth plurality of inverters 269. In an exemplary embodiment, an output node of each inverter of first plurality of inverters 266 may be connected to a supply node of a respective PLC of first plurality of PLCs 206. In an exemplary embodiment, an output node of each inverter of second plurality of inverters 267 may be connected to a supply node of a respective PLC of second plurality of PLCs 207. In an exemplary embodiment, an output node of each inverter of third plurality of inverters 268 may be connected to a supply node of a respective LUT of first plurality of LUTs 203. In an exemplary embodiment, an output node of each inverter of fourth plurality of inverters 269 may be connected to a supply node of a respective LUT of second plurality of LUTs 205.

In an exemplary embodiment, first PLC 208, second PLC 234, first LUT 204, and second LUT 209 may not be simultaneously utilized for implementation of Boolean function F. However, a static power consumption of first PLC 208, second PLC 234, first LUT 204, and second LUT 209 may be considerable even in an idle time. Accordingly, an energy efficiency of implementing Boolean function F may be increased by power gating first PLC 208, second PLC 234, first LUT 204, and second LUT 209. In doing so, in an exemplary embodiment, each of first PLC 208, second PLC 234, first LUT 204, and second LUT 209 that do not implement Boolean function F may be turned off, i.e., a supply node of each of first PLC 208, second PLC 234, first LUT 204, and second LUT 209 may be disconnected from a power supply of CLB 202. As a result, a static power consumption of CLB 202 may be decreased. To manage the static power consumption, a plurality of SRAM cells may be configured to activate a respective logic circuit.

In an exemplary embodiment, CLB 202 may further include a first plurality of SRAM cells 270, a second plurality of SRAM cells 271, a third plurality of SRAM cells 272, and a fourth plurality of SRAM cells 273. In an exemplary embodiment, each SRAM cell of first plurality of SRAM cells 270 may be connected to an input node of a respective inverter of first plurality of inverters 266. In an exemplary embodiment, each SRAM cell of first plurality of SRAM cells 271 may be configured to activate a respective PLC of first plurality of PLCs 206 utilizing a respective inverter of first plurality of inverters 266. In an exemplary embodiment, an output node of each of first plurality of inverters 266 may be connected to a supply node of a respective PLC of first plurality of PLCs 206. In an exemplary embodiment, each SRAM cell of second plurality of SRAM cells 271 may be connected to an input node of a respective inverter of second plurality of inverters 267. In an exemplary embodiment, each SRAM cell of second plurality of SRAM cells 271 may be configured to activate a respective PLC of second plurality of PLCs 207 utilizing a respective inverter of second plurality of inverters 267. In an exemplary embodiment, an output node of each of second plurality of inverters 267 may be connected to a supply node of a respective PLC of second plurality of PLCs 207. In an exemplary embodiment, each SRAM cell of third plurality of SRAM cells 272 may be connected to an input node of a respective inverter of third plurality of inverters 268. In an exemplary embodiment, each SRAM cell of third plurality of SRAM cells 272 may be configured to activate a respective LUT of first plurality of LUTs 203 utilizing a respective inverter of third plurality of inverters 268. In an exemplary embodiment, an output node of each of third plurality of inverters 268 may be connected to a supply node of a respective LUT of first plurality of LUTs 203. In an exemplary embodiment, each SRAM cell of fourth plurality of SRAM cells 273 may be connected to an input node of a respective inverter of fourth plurality of inverters 269. In an exemplary embodiment, each SRAM cell of fourth plurality of SRAM cells 273 may be configured to activate a respective LUT of second plurality of LUTs 205 utilizing a respective inverter of fourth plurality of inverters 269. In an exemplary embodiment, an output node of each of fourth plurality of inverters 269 may be connected to a supply node of a respective LUT of second plurality of LUTs 205.

Figure 4:
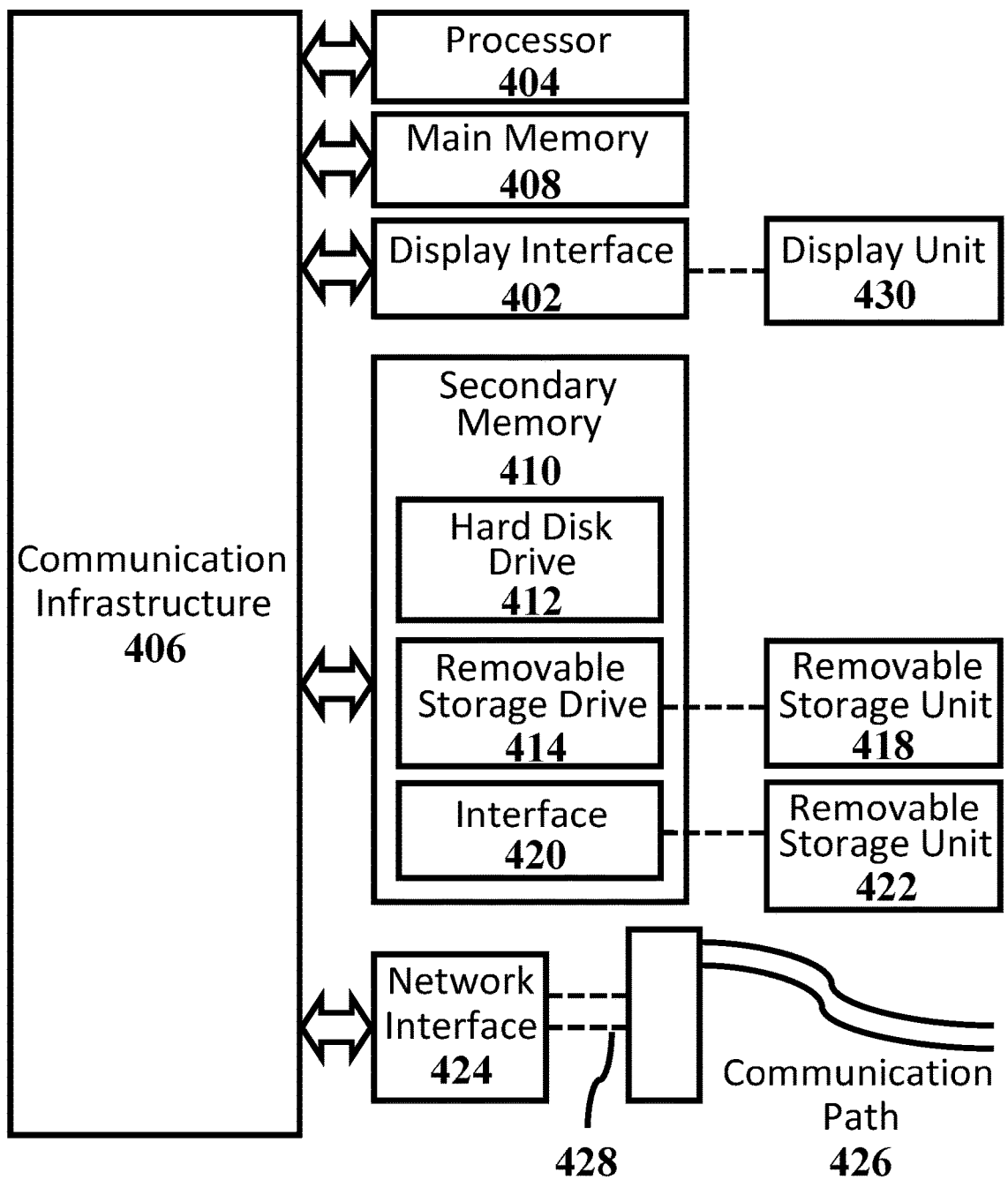
FIG. 4 shows a high-level functional block diagram of a computer system, consistent with one or more exemplary embodiments of the present disclosure.

FIG. 4 shows an example computer system 400 in which an embodiment of the present invention, or portions thereof, may be implemented as computer-readable code, consistent with exemplary embodiments of the present disclosure. For example, different steps of method 100A and method 100B may be implemented in computer system 400 using hardware, software, firmware, tangible computer readable media having instructions stored thereon, or a combination thereof and may be implemented in one or more computer systems or other processing systems. Hardware, software, or any combination of such may embody any of the modules and components in FIGS. 1A-3.

If programmable logic is used, such logic may execute on a commercially available processing platform or a special purpose device. One ordinary skill in the art may appreciate that an embodiment of the disclosed subject matter can be practiced with various computer system configurations, including multi-core multiprocessor systems, minicomputers, mainframe computers, computers linked or clustered with distributed functions, as well as pervasive or miniature computers that may be embedded into virtually any device.

For instance, a computing device having at least one processor device and a memory may be used to implement the above-described embodiments. A processor device may be a single processor, a plurality of processors, or combinations thereof. Processor devices may have one or more processor "cores."

An embodiment of the invention is described in terms of this example computer system 500. After reading this description, it will become apparent to a person skilled in the relevant art how to implement the invention using other computer systems and/or computer architectures. Although operations may be described as a sequential process, some of the operations may in fact be performed in parallel, concurrently, and/or in a distributed environment, and with program code stored locally or remotely for access by single or multi-processor machines. In addition, in some embodiments the order of operations may be rearranged without departing from the spirit of the disclosed subject matter.

Processor device 404 may be a special purpose (e.g., a graphical processing unit) or a general-purpose processor device. As will be appreciated by persons skilled in the relevant art, processor device 404 may also be a single processor in a multi-core/multiprocessor system, such system operating alone, or in a cluster of computing devices operating in a cluster or server farm. Processor device 404 may be connected to a communication infrastructure 406, for example, a bus, message queue, network, or multi-core message-passing scheme.

In an exemplary embodiment, computer system 400 may include a display interface 502, for example a video connector, to transfer data to a display unit 430, for example, a monitor. Computer system 400 may also include a main memory 408, for example, random access memory (RAM), and may also include a secondary memory 410. Secondary memory 410 may include, for example, a hard disk drive 412, and a removable storage drive 414. Removable storage drive 414 may include a floppy disk drive, a magnetic tape drive, an optical disk drive, a flash memory, or the like. Removable storage drive 414 may read from and/or write to a removable storage unit 418 in a well-known manner. Removable storage unit 418 may include a floppy disk, a magnetic tape, an optical disk, etc., which may be read by and written to by removable storage drive 414. As will be appreciated by persons skilled in the relevant art, removable storage unit 418 may include a computer usable storage medium having stored therein computer software and/or data.

In alternative implementations, secondary memory 410 may include other similar means for allowing computer programs or other instructions to be loaded into computer system 400. Such means may include, for example, a removable storage unit 422 and an interface 420. Examples of such means may include a program cartridge and cartridge interface (such as that found in video game devices), a removable memory chip (such as an EPROM, or PROM) and associated socket, and other removable storage units 422 and interfaces 420 which allow software and data to be transferred from removable storage unit 422 to computer system 400.

Computer system 400 may also include a communications interface 424. Communications interface 424 allows software and data to be transferred between computer system 400 and external devices. Communications interface 424 may include a modem, a network interface (such as an Ethernet card), a communications port, a PCMCIA slot and card, or the like. Software and data transferred via communications interface 424 may be in the form of signals, which may be electronic, electromagnetic, optical, or other signals capable of being received by communications interface 424. These signals may be provided to communications interface 424 via a communications path 426. Communications path 426 carries signals and may be implemented using wire or cable, fiber optics, a phone line, a cellular phone link, an RF link or other communications channels.

In this document, the terms "computer program medium" and "computer usable medium" are used to generally refer to media such as removable storage unit 418, removable storage unit 422, and a hard disk installed in hard disk drive 412. Computer program medium and computer usable medium may also refer to memories, such as main memory 508 and secondary memory 410, which may be memory semiconductors (e.g. DRAMs, etc.).

Computer programs (also called computer control logic) are stored in main memory 408 and/or secondary memory 410. Computer programs may also be received via communications interface 424. Such computer programs, when executed, enable computer system 400 to implement different embodiments of the present disclosure as discussed herein. In particular, the computer programs, when executed, enable processor device 404 to implement the processes of the present disclosure, such as the operations in method 100A illustrated by flowchart 100A of FIG. 1A discussed above. Accordingly, such computer programs represent controllers of computer system 400. Where exemplary embodiments of method 100A and method 100B are implemented using software, the software may be stored in a computer program product and loaded into computer system 400 using removable storage drive 414, interface 420, and hard disk drive 412, or communications interface 424.

Embodiments of the present disclosure also may be directed to computer program products including software stored on any computer useable medium. Such software, when executed in one or more data processing device, causes a data processing device to operate as described herein. An embodiment of the present disclosure may employ any computer useable or readable medium. Examples of computer useable mediums include, but are not limited to, primary storage devices (e.g., any type of random access memory), secondary storage devices (e.g., hard drives, floppy disks, CD ROMs, ZIP disks, tapes, magnetic storage devices, and optical storage devices, MEMS, nano-technological storage device, etc.).

The embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

EXAMPLE

In this example, a performance of a method (similar to method 100A and method 100B) and a CLB (similar to CLB 202) for mapping a Boolean function (similar to Boolean function F) is demonstrated. Different steps of the method are implemented utilizing a system analogous to system 200. An exemplary FPGA was utilized for implementing a convolutional neural network (CNN). The exemplary FPGA included a number of CLBs. The performance of the method was compared with three different types of FPGAs. A type-A FPGA included CLBs with 4-input LUTs, a type-B FPGA includes CLBs with 5-input LUTs, and a type-C FPGA includes CLBs with 6-input LUTs.

Figure 5:
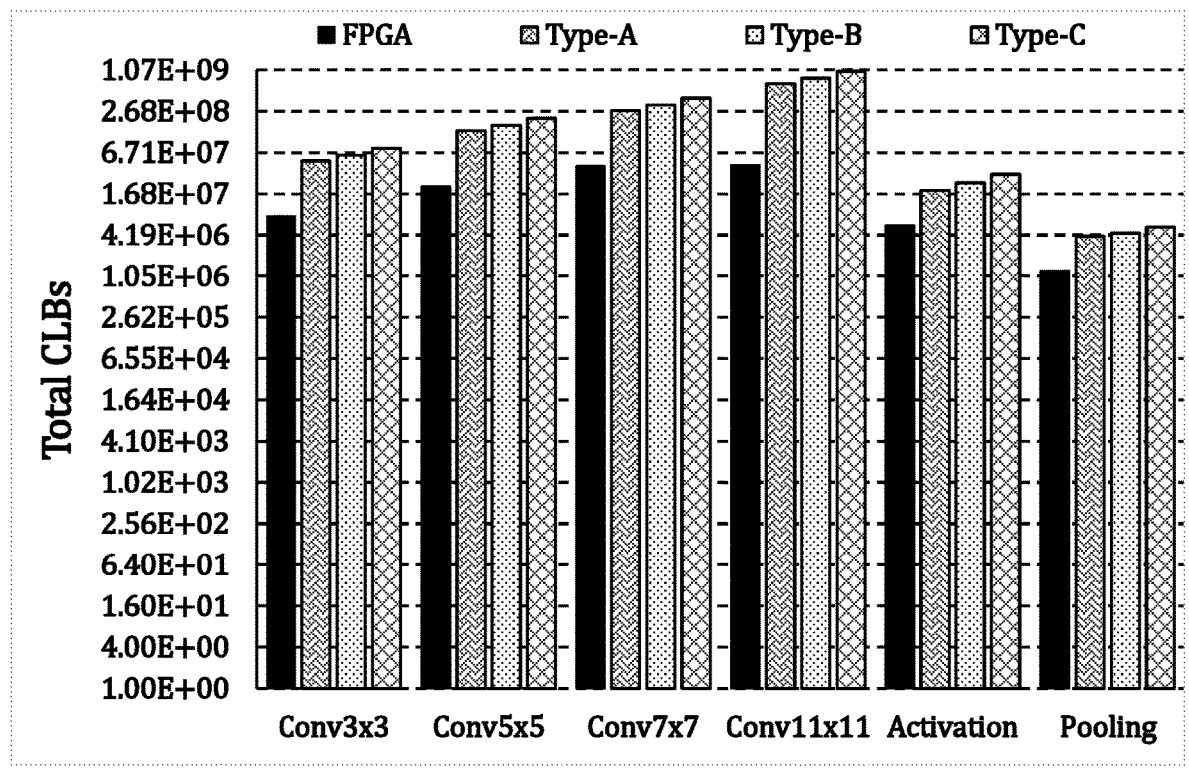
FIG. 5 shows a total number of utilized configurable logic blocks, consistent with exemplary embodiment of the present disclosure.

FIG. 5 shows a total number of utilized CLBs, consistent with exemplary embodiments of the present disclosure. As FIG. 5 shows, a number of utilized CLBs by the exemplary FPGA for implementing different convolutional layers of the CNN (i.e., 3×3 convolutional layers, 5×5 convolutional layers, 7×7 convolutional layers, and 11×11 convolutional layers) was 56%, 65%, and 77% less than a number of utilized CLBs in the type-A FPGA, the type-B FPGA, and the type-C FPGA, respectively. Moreover, a number of utilized CLBs by the exemplary FPGA for implementing activation functions of the CNN is 37%, 52%, and 71% less than a number of utilized CLBs in the type-A FPGA, the type-B FPGA, and the type-C FPGA, respectively. Similarly, a number of utilized CLBs by the exemplary FPGA for implementing pooling layers of the CNN was 39%, 50%, and 67% less than a number of utilized CLBs in the type-A FPGA, the type-B FPGA, and the type-C FPGA, respectively. In other words, the exemplary FPGA required a lower number of CLBs to implement the CNN, compared with the type-A FPGA, the type-B FPGA, and the type-C FPGA. As a result, a capacity of implementing Boolean functions was higher in a same area, compared with the type-A FPGA, the type-B FPGA, and the type-C FPGA.

Figure 6:
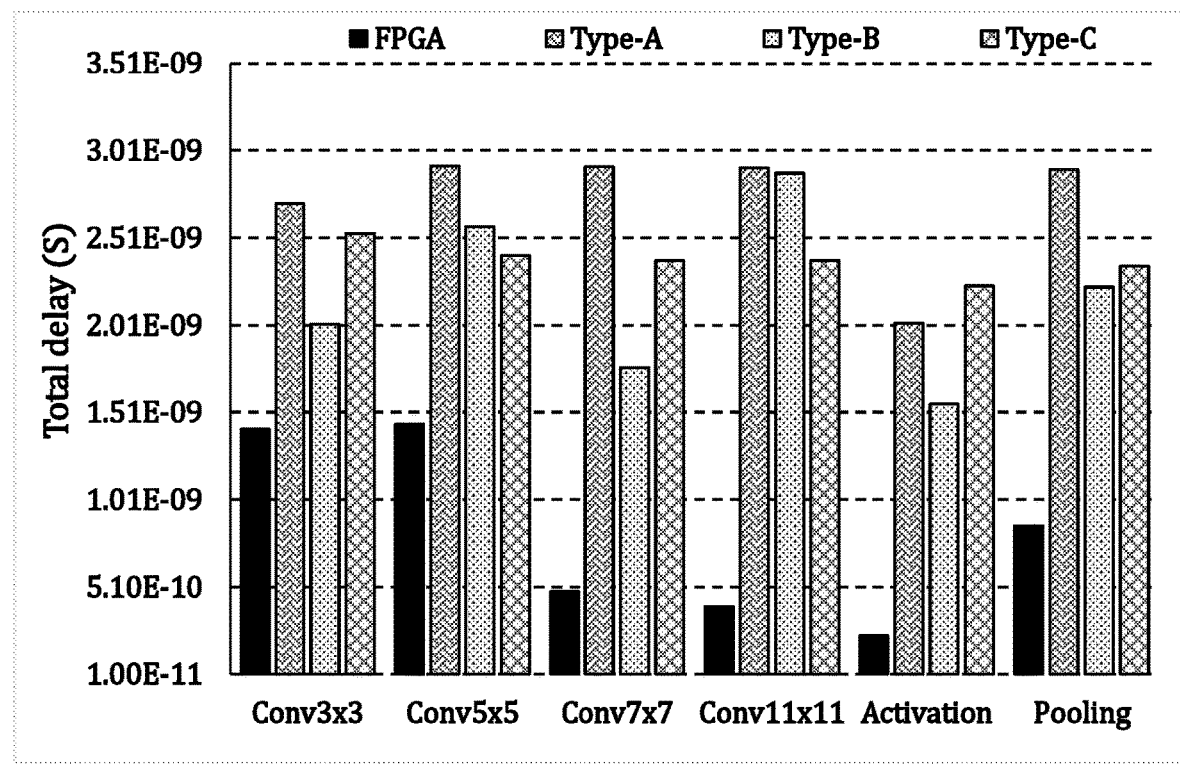
FIG. 6 shows a total delay of implementing Boolean functions, consistent with exemplary embodiments of the present disclosure.

FIG. 6 shows a total delay of implementing Boolean functions, consistent with exemplary embodiments of the present disclosure. As FIG. 6 shows, a total delay of utilized CLBs by the exemplary FPGA for implementing different convolutional layers of the CNN was 67%, 58%, and 62% less than a total delay of utilized CLBs in the type-A FPGA, the type-B FPGA, and the type-C FPGA, respectively. Moreover, a total delay of utilized CLBs by the exemplary FPGA for implementing activation functions of the CNN was 88%, 85%, and 90% less than a total delay of utilized CLBs in the type-A FPGA, the type-B FPGA, and the type-C FPGA, respectively. Similarly, a total delay of utilized CLBs by the exemplary FPGA for implementing pooling layers of the CNN is 70%, 61%, and 63% less than a total delay of utilized CLBs in the type-A FPGA, the type-B FPGA, and the type-C FPGA, respectively. In other words, the exemplary FPGA required a lower amount of time to implement the CNN, compared with the type-A FPGA, the type-B FPGA, and the type-C FPGA. As a result, a capacity of implementing Boolean functions was higher in a same time, compared with the type-A FPGA, the type-B FPGA, and the type-C FPGA.

Figure 7:
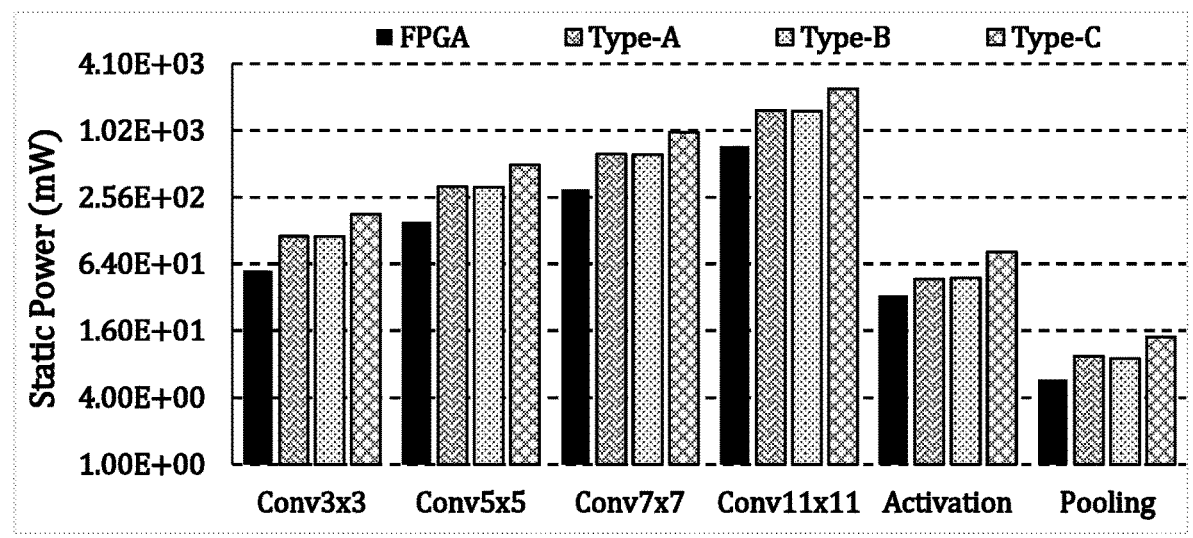
FIG. 7 shows a static power consumption of implementing Boolean functions, consistent with exemplary embodiments of the present disclosure.

FIG. 7 shows a static power consumption of implementing Boolean functions, consistent with exemplary embodiments of the present disclosure. As FIG. 7 shows, a static power consumption of utilized CLBs by the exemplary FPGA for implementing different convolutional layers of the CNN was 46%, 45%, and 66% less than a static power consumption of utilized CLBs in the type-A FPGA, the type-B FPGA, and the type-C FPGA, respectively. Moreover, a static power consumption of utilized CLBs by the exemplary FPGA for implementing activation functions of the CNN was 29%, 31%, and 59% less than a static power consumption of utilized CLBs in the type-A FPGA, the type-B FPGA, and the type-C FPGA, respectively. Similarly, a static power consumption of utilized CLBs by the exemplary FPGA for implementing pooling layers of the CNN is 38%, 35%, and 59% less than a static power consumption of utilized CLBs in the type-A FPGA, the type-B FPGA, and the type-C FPGA, respectively. In other words, the exemplary FPGA required a lower static power consumption to implement the CNN, compared with the type-A FPGA, the type-B FPGA, and the type-C FPGA.

While the foregoing has described what may be considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations. This is for purposes of streamlining the disclosure, and is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separately claimed subject matter.

While various implementations have been described, the description is intended to be exemplary, rather than limiting and it will be apparent to those of ordinary skill in the art that many more implementations and implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in light of the attached claims and their equivalents. Also, various modifications and changes may be made within the scope of the attached claims.

What is claimed is:

1. A configurable logic block (CLB) for implementing a Boolean function, the CLB comprising:
    a first plurality of look-up tables (LUTs) comprising 4N LUTs where N≥1, a first LUT of the first plurality of LUTs comprising:
        a $(1,1)^{th}$ input node;
        a $(2,1)^{th}$ input node;
        a first LUT output node;
    a second plurality of LUTs comprising N LUTs, a second LUT of the second plurality of LUTs comprising:
        a $(1,2)^{th}$ input node;
        a $(2,2)^{th}$ input node;
        a $(3,2)^{th}$ input node;
        a $(4,2)^{th}$ input node;
        a $(5,2)^{th}$ input node;
        a second LUT output node;
    a first plurality of programmable logic cells (PLCs) comprising 9N PLCs, a first PLC of the first plurality of PLCs comprising:
        a third LUT comprising:
            a $(1,3)^{th}$ input node;
            a $(2,3)^{th}$ input node; and
            a third LUT output node;
        a fourth LUT comprising:
            a $(1,4)^{th}$ input node;
            a $(2,4)^{th}$ input node; and
            a fourth LUT output node;
        a fifth LUT comprising:
            a $(1,5)^{th}$ input node;
            a $(2,5)^{th}$ input node; and
            a fifth LUT output node;
        a multiplexer comprising:
            a first multiplexer input node connected to the fourth LUT output node;
            a second multiplexer input node connected to the fifth LUT output node;
            a multiplexer output node; and
            a selector input node;
        a first XNOR gate comprising:
            a $(1,1)^{th}$ XNOR input node connected to the third LUT output node;
            a $(2,1)^{th}$ XNOR input node connected to the multiplexer output node;
            and
            a first XNOR output node; and
    a second plurality of PLCs comprising 6N PLCs, a second PLC of the second plurality of PLCs comprising:
        a sixth LUT comprising:
            a $(1,6)^{th}$ input node;
            a $(2,6)^{th}$ input node; and
            a sixth LUT output node;
        a seventh LUT comprising:
            a $(1,7)^{th}$ input node;
            a $(2,7)^{th}$ input node;
            a $(3,7)^{th}$ input node; and
            a seventh LUT output node;
        an eighth LUT comprising:
            a $(1,8)^{th}$ input node;
            a $(2,8)^{th}$ input node;

a (3,8)$^{th}$ input node; and
an eighth LUT output node;
a NAND gate comprising:
a first NAND input node connected to the sixth LUT output node;
a second NAND input node connected to the seventh LUT output node; and
a NAND output node; and
a second XNOR gate comprising:
a (1,2)$^{th}$ XNOR input node connected to the NAND output node;
a (2,2)$^{th}$ XNOR input node connected to the eighth LUT output node; and
a second XNOR output node;
a first plurality of inverters, an output node of each inverter of the first plurality of inverters connected to a supply node of a respective PLC of the first plurality of PLCs;
a second plurality of inverters, an output node of each inverter of the second plurality of inverters connected to a supply node of a respective PLC of the second plurality of PLCs;
a third plurality of inverters, an output node of each inverter of the third plurality of inverters connected to a supply node of a respective LUT of the first plurality of LUTs;
a fourth plurality of inverters, an output node of each inverter of the fourth plurality of inverters connected to a supply node of a respective LUT of the second plurality of LUTs;
a first plurality of static random access memory (SRAM) cells, each SRAM cell of the first plurality of SRAM cells connected to an input node of a respective inverter of the first plurality of inverters, each SRAM cell of the first plurality of SRAM cells configured to activate a respective PLC of the first plurality of PLCs utilizing a respective inverter of the first plurality of inverters;
a second plurality of SRAM cells, each SRAM cell of the second plurality of SRAM cells connected to an input node of a respective inverter of the second plurality of inverters, each SRAM cell of the second plurality of SRAM cells configured to activate a respective PLC of the second plurality of PLCs utilizing a respective inverter of the second plurality of inverters;
a third plurality of SRAM cells, each SRAM cell of the third plurality of SRAM cells connected to an input node of a respective inverter of the third plurality of inverters, each SRAM cell of the third plurality of SRAM cells configured to activate a respective LUT of the first plurality of LUTs utilizing a respective inverter of the third plurality of inverters; and
a fourth plurality of SRAM cells, each SRAM cell of the fourth plurality of SRAM cells connected to an input node of a respective inverter of the fourth plurality of inverters, each SRAM cell of the fourth plurality of SRAM cells configured to activate a respective LUT of the second plurality of LUTs utilizing a respective inverter of the fourth plurality of inverters.

2. A method for mapping a Boolean function to a configurable logic block (CLB) comprising a first plurality of programmable logic cells (PLCs), the Boolean function comprising a plurality of digits, each of the plurality of digits comprising a respective hexadecimal value, the method comprising, utilizing one or more processors, mapping the Boolean function to a first PLC of the first plurality of PLCs responsive to the plurality of digits satisfying a first condition, the first condition comprising:
at least two digits of the plurality of digits being different; and
each of the plurality of digits comprising one of a first hexadecimal digit, a second hexadecimal digit different from the first hexadecimal digit, a bitwise complement of the first hexadecimal digit, and a bitwise complement of the second hexadecimal digit.

3. The method of claim 2 further comprising mapping the Boolean function to a second PLC of a second plurality of PLCs in the CLB responsive to the plurality of digits satisfying a second condition, the second condition comprising one of:
a first sub-condition comprising:
at least two digits of the plurality of digits being different;
at least one of the plurality of digits comprising one of 0x0 or 0xF; and
each of the plurality of digits comprising one of the first hexadecimal digit, the second hexadecimal digit, a bitwise complement of the first hexadecimal digit, a bitwise complement of the second hexadecimal digit, 0x0, or 0xF; and
a second sub-condition comprising:
at least two digits of a plurality of negation-permutation-negation (NPN) digits associated with an NPN Boolean function obtained from the Boolean function being different;
at least one of the plurality of NPN digits comprising one of 0x0 or 0xF; and
each of the plurality of NPN digits comprising one of the first hexadecimal digit, the second hexadecimal digit, a bitwise complement of the first hexadecimal digit, a bitwise complement of the second hexadecimal digit, 0x0, or 0xF.

4. The method of claim 3 further comprising, prior to mapping the Boolean function to the first PLC, mapping the Boolean function to a first look-up table (LUT) of a first plurality of LUTs in the CLB responsive to the plurality of digits satisfying a third condition, the third condition comprising each of the plurality of digits equal to a third hexadecimal digit.

5. The method of claim 4 further comprising mapping the Boolean function to a second LUT of a second plurality of LUTs in the CLB responsive to the first condition, the second condition, and the third condition not being satisfied.

6. The method of claim 5, wherein mapping the Boolean function to the first PLC comprises mapping a plurality of inputs associated with the Boolean function to the first PLC, a number of the first plurality of PLCs equals to 9N where N≥1, mapping the plurality of inputs to the first PLC comprising:
mapping a first input of the plurality of inputs to a (1,3)$^{th}$ input node of a third LUT associated with the first PLC;
mapping a second input of the plurality of inputs to a (2,3)$^{th}$ input node of the third LUT, a third LUT output node of the third LUT connected to a (1,1)$^{th}$ XNOR input node of a first XNOR gate associated with the first PLC;
mapping a third input of the plurality of inputs to a selector input node of a multiplexer associated with the first PLC, a multiplexer output node of the multiplexer connected to a (2,1)$^{th}$ XNOR input node of the first XNOR gate;

mapping a fourth input of the plurality of inputs to a $(1,4)^{th}$ input node of a fourth LUT associated with the first PLC;

mapping a fifth input of the plurality of inputs to a $(2,4)^{th}$ input node of the fourth LUT, a fourth LUT output node of the fourth LUT connected to a first multiplexer input node of the multiplexer;

mapping the fourth input to a $(1,5)^{th}$ input node of a fifth LUT associated with the first PLC; and mapping the fifth input to a $(2,5)^{th}$ input node of the fifth LUT, a fifth LUT output node of the fifth LUT connected to a second multiplexer input node of the multiplexer.

7. The method of claim 6, wherein mapping the Boolean function to the second PLC comprises mapping the plurality of inputs to the second PLC, a number of the second plurality of PLCs equals to 6N, mapping the plurality of inputs to the second PLC comprising:

mapping the fourth input to a $(1,6)^{th}$ input node of a sixth LUT associated with the second PLC;

mapping the fifth input to a $(2,6)^{th}$ input node of the sixth LUT, a sixth LUT output node of the sixth LUT connected to a first NAND input node of a NAND gate associated with the second PLC;

mapping the third input to a $(1,7)^{th}$ input node of a seventh LUT associated with the second PLC;

mapping the second input to a $(2,7)^{th}$ input node of the seventh LUT;

mapping the first input to a $(3,7)^{th}$ input node of the seventh LUT, a seventh LUT output node of the seventh LUT connected to a second NAND input node of the NAND gate, a NAND output node of the NAND gate connected to a $(1,2)^{th}$ XNOR input node of a second XNOR gate associated with the second PLC;

mapping the third input to a $(1,8)^{th}$ input node of an eighth LUT associated with the second PLC;

mapping the second input to a $(2,8)^{th}$ input node of the eighth LUT; and mapping the first input to a $(3,8)^{th}$ input node of the eighth LUT, an eighth LUT output node of the eighth LUT connected to a $(2,2)^{th}$ XNOR input node of the second XNOR gate.

8. The method of claim 6, wherein mapping the Boolean function to the first LUT comprises mapping the plurality of inputs to the first LUT, a number of the first plurality of LUTs equals 4N, mapping the plurality of inputs to the first LUT comprising:

mapping the fourth input to a $(1,1)^{th}$ input node of the first LUT; and mapping the fifth input to a $(2,1)^{th}$ input node of the first LUT.

9. The method of claim 6, wherein mapping the Boolean function to the second LUT comprises mapping the plurality of inputs to the second LUT, a number of the second plurality of LUTs equals N, mapping the plurality of inputs to the second LUT comprising:

mapping the first input to a $(1,2)^{th}$ input node of the second LUT;

mapping the second input to a $(2,2)^{th}$ input node of the second LUT;

mapping the third input to a $(3,2)^{th}$ input node of the second LUT;

mapping the fourth input to a $(4,2)^{th}$ input node of the second LUT; and mapping the fifth input to a $(5,2)^{th}$ input node of the second LUT.

10. A system for mapping a Boolean function to a configurable logic block (CLB), the system comprising:

a configurable logic block (CLB) comprising a first plurality of programmable logic cells (PLCs);

a memory having processor-readable instructions stored therein; and one or more processors configured to access the memory and execute the processor-readable instructions, which, when executed by the one or more processors configures the processor to perform a method, the method comprising mapping the Boolean function to a first PLC of the first plurality of PLCs responsive to a plurality of digits associated with the Boolean function satisfying a first condition, each of the plurality of digits comprising a respective hexadecimal value, the first condition comprising:

at least two digits of the plurality of digits being different; and each of the plurality of digits comprising one of a first hexadecimal digit, a second hexadecimal digit different from the first hexadecimal digit, a bitwise complement of the first hexadecimal digit, and a bitwise complement of the second hexadecimal digit.

11. The system of claim 10, wherein the CLB further comprises:

a first plurality of look-up tables (LUTs), a first LUT of the first plurality of LUTs comprising:
 a $(1,1)^{th}$ input node;
 a $(2,1)^{th}$ input node; and
 a first LUT output node; and a second plurality of LUTs, a second LUT of the second plurality of LUTs comprising:
 a $(1,2)^{th}$ input node;
 a $(2,2)^{th}$ input node;
 a $(3,2)^{th}$ input node;
 a $(4,2)^{th}$ input node;
 a $(5,2)^{th}$ input node; and
 a second LUT output node.

12. The system of claim 11, wherein the first PLC comprises:

a third LUT comprising:
 a $(1,3)^{th}$ input node;
 a $(2,3)^{th}$ input node; and
 a third LUT output node;

a fourth LUT comprising:
 a $(1,4)^{th}$ input node;
 a $(2,4)^{th}$ input node; and
 a fourth LUT output node;

a fifth LUT comprising:
 a $(1,5)^{th}$ input node;
 a $(2,5)^{th}$ input node; and
 a fifth LUT output node;

a multiplexer comprising:
 a first multiplexer input node connected to the fourth LUT output node;
 a second multiplexer input node connected to the fifth LUT output node;
 a multiplexer output node; and
 a selector input node; and a first XNOR gate comprising:
 a $(1,1)^{th}$ XNOR input node connected to the third LUT output node;
 a $(2,1)^{th}$ XNOR input node connected to the multiplexer output node; and
 a first XNOR output node.

13. The system of claim 12, wherein the CLB further comprises a second plurality of PLCs, a second PLC of the second plurality of PLCs comprising:
- a sixth LUT comprising:
  - a $(1,6)^{th}$ input node;
  - a $(2,6)^{th}$ input node; and
  - a sixth LUT output node;
- a seventh LUT comprising:
  - a $(1,7)^{th}$ input node;
  - a $(2,7)^{th}$ input node;
  - a $(3,7)^{th}$ input node; and
  - a seventh LUT output node;
- an eighth LUT comprising:
  - a $(1,8)^{th}$ input node;
  - a $(2,8)^{th}$ input node;
  - a $(3,8)^{th}$ input node; and
  - an eighth LUT output node;
- a NAND gate comprising:
  - a first NAND input node connected to the sixth LUT output node;
  - a second NAND input node connected to the seventh LUT output node; and
  - a NAND output node; and
- a second XNOR gate comprising:
  - a $(1,2)^{th}$ XNOR input node connected to the NAND output node;
  - a $(2,2)^{th}$ XNOR input node connected to the eighth LUT output node; and
  - a second XNOR output node.

14. The system of claim 13, wherein the method further comprises mapping the Boolean function to the second PLC responsive to the plurality of digits satisfying a second condition, mapping the Boolean function to the second PLC comprising mapping a plurality of inputs associated with the Boolean function to the second PLC, comprising:
- mapping a first input of the plurality of inputs to the $(3,7)^{th}$ input node;
- mapping the first input to the $(3,8)^{th}$ input node;
- mapping a second input of the plurality of inputs to the $(2,7)^{th}$ input node;
- mapping the second input to the $(2,8)^{th}$ input node;
- mapping a third input of the plurality of inputs to the $(1,7)^{th}$ input node;
- mapping the third input to the $(1,8)^{th}$ input node;
- mapping a fourth input of the plurality of inputs to the $(1,6)^{th}$ input node; and
- mapping a fifth input of the plurality of inputs to the $(2,6)^{th}$ input node.

15. The system of claim 14, wherein the method further comprises, prior to mapping the Boolean function to the first PLC, mapping the Boolean function to the first LUT responsive to the plurality of digits satisfying a third condition, mapping the Boolean function to the first LUT comprising mapping the plurality of inputs to the first LUT, comprising:
- mapping the fourth input to the $(1,1)^{th}$ input node; and
- mapping the fifth input to the $(2,1)^{th}$ input node.

16. The system of claim 15, wherein mapping the Boolean function to the first PLC comprises mapping the plurality of inputs to the first PLC, comprising:
- mapping the first input to the $(1,3)^{th}$ input node;
- mapping the second input to the $(2,3)^{th}$ input node;
- mapping the third input to the selector input node;
- mapping the fourth input to the $(1,4)^{th}$ input node;
- mapping the fourth input to the $(1,5)^{th}$ input node;
- mapping the fifth input to the $(2,4)^{th}$ input node; and
- mapping the fifth input to the $(2,5)^{th}$ input node.

17. The system of claim 16, wherein the method further comprises mapping the Boolean function to the second LUT responsive to the plurality of digits satisfying a fourth condition, mapping the Boolean function to the second LUT comprising mapping the plurality of inputs to the second LUT, comprising:
- mapping the first input to the $(1,2)^{th}$ input node;
- mapping the second input to the $(2,2)^{th}$ input node;
- mapping the third input to the $(3,2)^{th}$ input node;
- mapping the fourth input to the $(4,2)^{th}$ input node; and
- mapping the fifth input to the $(5,2)^{th}$ input node.

18. The system of claim 17, wherein:
the second condition comprises one of:
- a first sub-condition comprising:
  - at least two digits of the plurality of digits being different;
  - at least one of the plurality of digits comprising one of 0x0 or 0xF; and
  - each of the plurality of digits comprising one of the first hexadecimal digit, the second hexadecimal digit, a bitwise complement of the first hexadecimal digit, a bitwise complement of the second hexadecimal digit, 0x0, or 0xF; and
- a second sub-condition comprising:
  - at least two digits of a plurality of negation-permutation-negation (NPN) digits associated with an NPN Boolean function obtained from the Boolean function being different,;
  - at least one of the plurality of NPN digits comprising one of 0x0 or 0xF;
  and
  - each of the plurality of NPN digits comprising one of the first hexadecimal digit, the second hexadecimal digit, a bitwise complement of the first hexadecimal digit, a bitwise complement of the second hexadecimal digit, 0x0, or 0xF;

the third condition comprises each of the plurality of digits equal to a third hexadecimal digit; and
the fourth condition comprises the first condition, the second condition, and the third condition not being satisfied.

19. The system of claim 13, wherein the CLB further comprises:
- a first plurality of inverters, an output node of each inverter of the first plurality of inverters connected to a supply node of a respective PLC of the first plurality of PLCs;
- a second plurality of inverters, an output node of each inverter of the second plurality of inverters connected to a supply node of a respective PLC of the second plurality of PLCs;
- a third plurality of inverters, an output node of each inverter of the third plurality of inverters connected to a supply node of a respective LUT of the first plurality of LUTs;
- a fourth plurality of inverters, an output node of each inverter of the fourth plurality of inverters connected to a supply node of a respective LUT of the second plurality of LUTs;
- a first plurality of static random access memory (SRAM) cells, each SRAM cell of the first plurality of SRAM cells connected to an input node of a respective inverter of the first plurality of inverters, each SRAM cell of the first plurality of SRAM cells configured to activate a respective PLC of the first plurality of PLCs utilizing a respective inverter of the first plurality of inverters;

a second plurality of SRAM cells, each SRAM cell of the second plurality of SRAM cells connected to an input node of a respective inverter of the second plurality of inverters, each SRAM cell of the second plurality of SRAM cells configured to activate a respective PLC of the second plurality of PLCs utilizing a respective inverter of the second plurality of inverters;

a third plurality of SRAM cells, each SRAM cell of the third plurality of SRAM cells connected to an input node of a respective inverter of the third plurality of inverters, each SRAM cell of the third plurality of SRAM cells configured to activate a respective LUT of the first plurality of LUTs utilizing a respective inverter of the third plurality of inverters; and a fourth plurality of SRAM cells, each SRAM cell of the fourth plurality of SRAM cells connected to an input node of a respective inverter of the fourth plurality of inverters, each SRAM cell of the fourth plurality of SRAM cells configured to activate a respective LUT of the second plurality of LUTs utilizing a respective inverter of the fourth plurality of inverters.

20. The system of 13, wherein:

a first plurality of PLCs comprises 9N PLCs, where $N \geq 1$;

a second plurality of PLCs comprises 6N PLCs;

a first plurality of LUTs comprises 4N LUTs; and a second plurality of LUTs comprises N LUTs.

* * * * *